US011289503B2

United States Patent
(12) United States Patent
Lee et al.

(10) Patent No.: US 11,289,503 B2
(45) Date of Patent: Mar. 29, 2022

(54) THREE-DIMENSIONAL SEMICONDUCTOR MEMORY DEVICE

(71) Applicant: SAMSUNG ELECTRONICS CO., LTD., Suwon-si (KR)

(72) Inventors: Byungjin Lee, Suwon-si (KR); Dong-sik Lee, Suwon-si (KR); Joon-Sung Lim, Suwon-si (KR)

(73) Assignee: SAMSUNG ELECTRONICS CO., LTD., Suwon-si (KR)

(*) Notice: Subject to any disclaimer, the term of this patent is extended or adjusted under 35 U.S.C. 154(b) by 117 days.

(21) Appl. No.: 16/773,084

(22) Filed: Jan. 27, 2020

(65) Prior Publication Data

US 2020/0373324 A1 Nov. 26, 2020

(30) Foreign Application Priority Data

May 22, 2019 (KR) ........................ 10-2019-0060206

(51) Int. Cl.

| | |
|---|---|
| ***H01L 27/11582*** | (2017.01) |
| ***H01L 27/11565*** | (2017.01) |
| *H01L 21/306* | (2006.01) |
| *H01L 21/308* | (2006.01) |
| *H01L 21/02* | (2006.01) |
| *H01L 21/28* | (2006.01) |
| *H01L 29/51* | (2006.01) |

(52) U.S. Cl.

CPC .. *H01L 27/11582* (2013.01); *H01L 27/11565* (2013.01); *H01L 21/0262* (2013.01); *H01L 21/02532* (2013.01); *H01L 21/02636* (2013.01); *H01L 21/308* (2013.01); *H01L 21/30604* (2013.01); *H01L 29/40117* (2019.08); *H01L 29/513* (2013.01)

(58) Field of Classification Search

CPC .................... H01L 27/11578; H01L 27/11582
See application file for complete search history.

(56) References Cited

U.S. PATENT DOCUMENTS

| | | | |
|---|---|---|---|
| 8,969,948 | B2 | 3/2015 | Simsek-Ege et al. |
| 9,548,313 | B2 | 1/2017 | Yada et al. |
| 9,634,025 | B2 | 4/2017 | Sun et al. |
| 9,768,180 | B1 | 9/2017 | Zhou et al. |
| 9,780,102 | B2 | 10/2017 | Simsek-Ege et al. |

(Continued)

FOREIGN PATENT DOCUMENTS

KR 10-2018-0110797 A 10/2018

*Primary Examiner* — Christopher A Johnson
(74) *Attorney, Agent, or Firm* — Sughrue Mion, PLLC

(57) ABSTRACT

A semiconductor device is provided. The semiconductor device includes a stack structure that includes a plurality of dielectric layers spaced apart from each other on a substrate, a plurality of electrodes interposed between the plurality of dielectric layers, and a plurality of stopper layers interposed between the plurality of dielectric layers; and a vertical channel structure that penetrates the stack structure. Each of the plurality of electrodes and the plurality of stopper layers is disposed in a corresponding empty space interposed between the plurality of dielectric layers, the plurality of stopper layers includes a first stopper layer and a second stopper layer that is interposed between the first stopper layer and the substrate, and at least one of the plurality of electrodes is interposed between the first stopper layer and the second stopper layer.

20 Claims, 21 Drawing Sheets

(56) References Cited

U.S. PATENT DOCUMENTS

| | | | |
|---|---|---|---|
| 9,922,990 B2 | | 3/2018 | Song |
| 10,115,730 B1 | | 10/2018 | Baraskar et al. |
| 2018/0151672 A1 | * | 5/2018 | Choi .................. H01L 27/1157 |
| 2018/0240811 A1 | | 8/2018 | Kim et al. |
| 2018/0286678 A1 | | 10/2018 | Lee |
| 2018/0331118 A1 | * | 11/2018 | Amano ............. H01L 21/76858 |
| 2019/0081067 A1 | * | 3/2019 | Eom .................. H01L 27/1157 |

* cited by examiner

THREE-DIMENSIONAL SEMICONDUCTOR MEMORY DEVICE

CROSS-REFERENCE TO RELATED APPLICATION

This application claims priority from Korean Patent Application No. 10-2019-0060206, filed on May 22, 2019 in the Korean Intellectual Property Office, the disclose of which is incorporated by reference herein in its entirety.

BACKGROUND

1. Field

Apparatuses and methods consistent with example embodiments relate to a semiconductor device, and more particularly, to a three-dimensional semiconductor memory device with improved reliability.

2. Related Art

Semiconductor devices have become increasingly integrated improve performance and reduce manufacture costs. Integration of typical two-dimensional or planar semiconductor devices is primarily determined by the area occupied by a unit memory cell, and is therefore greatly influenced by the level of technology for forming fine patterns. However, expensive processing equipment is needed to increase pattern fineness and may result in a practical limitation on the integration degree of the two-dimensional or planar semiconductor devices. Therefore, three-dimensional semiconductor memory devices with three-dimensionally arranged memory cells have been proposed.

SUMMARY

One or more example embodiments provide a three-dimensional semiconductor memory device with improved reliability.

According to some example embodiments, a semiconductor memory device includes: a stack structure that includes a plurality of dielectric layers spaced apart from each other on a substrate, a plurality of electrodes interposed between the plurality of dielectric layers, and a plurality of stopper layers interposed between the plurality of dielectric layers; and a vertical channel structure that penetrates the stack structure. Each of the plurality of electrodes and the plurality of stopper layers is disposed in a corresponding empty space interposed between the plurality of dielectric layers, the plurality of stopper layers includes a first stopper layer and a second stopper layer that is interposed between the first stopper layer and the substrate, and at least one of the plurality of electrodes is interposed between the first stopper layer and the second stopper layer According to some example embodiments a semiconductor memory device includes: a stack structure disposed on a substrate; and a vertical channel structure that penetrates the stack structure. The stack structure includes: a first stopper layer; and a plurality of dielectric layers and a plurality of electrodes that are alternately stacked between the first stopper layer and the substrate. A first distance is provided between bottom surfaces of a first electrode and a second electrode, from among the plurality of electrodes, that are adjacent to each other, a second distance is provided between a bottom surface of the first stopper layer and a bottom surface of an uppermost one of the plurality of electrodes, and the first distance and the second distance are substantially the same.

According to some example embodiments a semiconductor memory device, includes: a first stack structure disposed on a substrate, the first stack structure including a first stopper layer, a first plurality of dielectric layers and a first plurality of electrodes, the first plurality of dielectric layers and the first plurality of electrodes being alternately stacked on the first stopper layer; and a vertical channel structure that penetrates the first stack structure. The vertical channel structure includes: a first region that penetrates the first plurality of dielectric layers and the first plurality of electrodes; and a second region that penetrates the first stopper layer. A change in diameter of the first region with respect to a first length is different from a change in diameter of the second region with respect to the first length.

DETAILED DESCRIPTION

Figure 1:
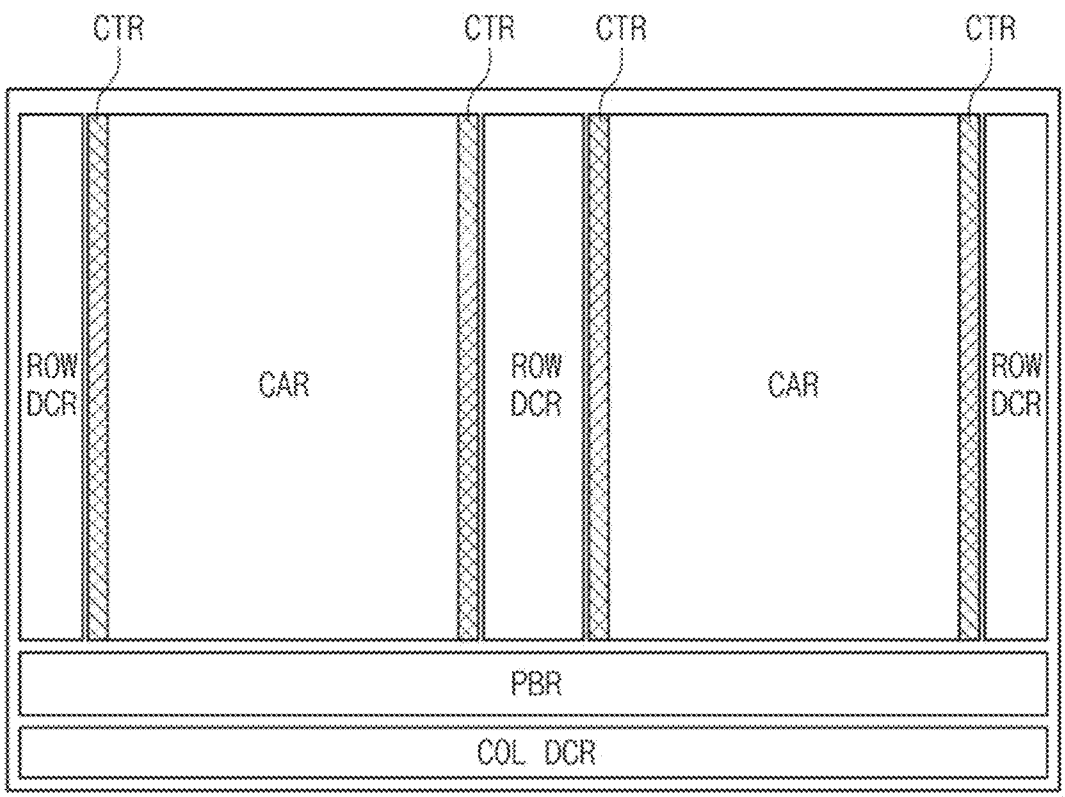
FIG. 1 illustrates a schematic diagram showing a simplified configuration of a three-dimensional semiconductor memory device according to one or more example embodiments.

FIG. 1 illustrates a schematic diagram of a three-dimensional semiconductor memory device according to one or more example embodiments.

Referring to FIG. 1, a three-dimensional semiconductor memory device may include a cell array region CAR and a peripheral circuit region. The peripheral circuit region may include row decoder regions ROW DCR, a page buffer region PBR, a column decoder region COL DCR, and a control circuit region. According to one or more example embodiments, a connection region CTR may be disposed between the cell array region CAR and the row decoder regions ROW DCR.

The cell array region CAR may include a memory cell array consisting of a plurality of memory cells. In one or more example embodiments, the memory cell array may include three-dimensionally arranged memory cells and a plurality of word lines and bit lines electrically connected to the memory cells.

The row decoder region ROW DCR may include a row decoder that selects the word lines of the memory cell array, and the connection region CTR may include a connection line structure that electrically connects the memory cell array and the row decoder to each other. Based on address information, the row decoder may select one of the word lines of the memory cell array. The row decoder may provide word line voltages to the selected word line and unselected word lines based on a control signal from a control circuit.

The page buffer region PBR may include a page buffer that reads data stored in the memory cells. Depending on an operating mode, the page buffer may temporarily store data to be stored in the memory cells or sense data stored in the memory cells. The page buffer may act as a write driver circuit in a program operating mode and as a sense amplifier circuit in a read operating mode.

The column decoder region COL DCR may include a column decoder connected to the bit lines of the memory cell array. The column decoder may provide a data transmission path between the page buffer and an external device (e.g., a memory controller).

Figure 2:
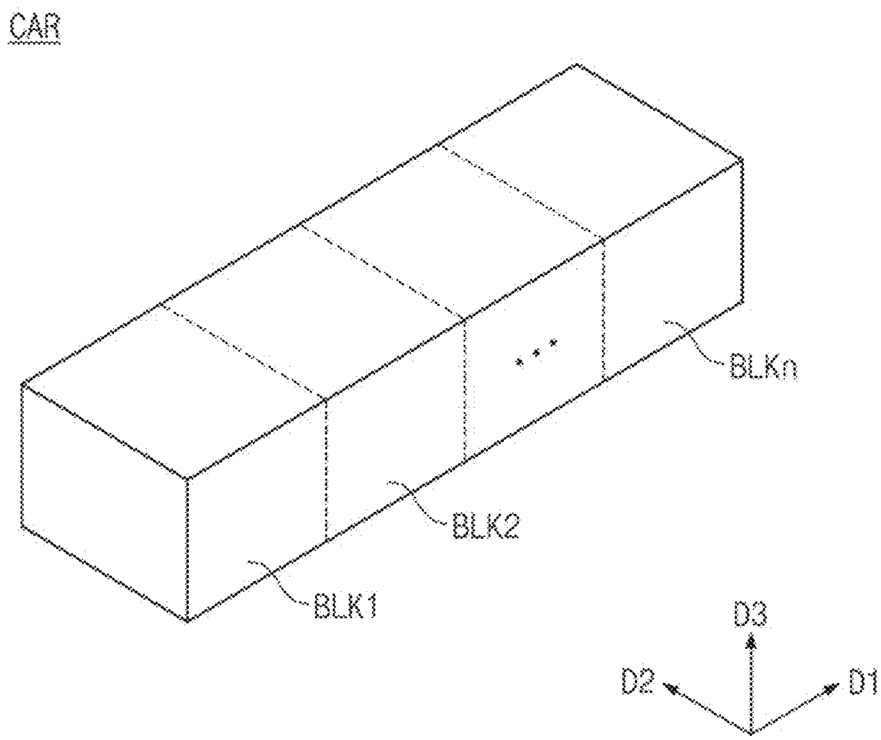
FIG. 2 illustrates a simplified block diagram showing a cell array of a three-dimensional semiconductor memory device according to one or more example embodiments.

FIG. 2 illustrates a simplified block diagram showing a cell array of a three-dimensional semiconductor memory device according to one or more example embodiments.

Referring to FIG. 2, the cell array region CAR may include a plurality of cell array blocks BLK1, BLK2, . . . , and BLKn. Each of the cell array blocks BLK1, BLK2, . . . , and BLKn may include a stack structure having electrodes stacked along a third direction D3 on a plane elongated along first and second directions D1 and D2. The stack structure may combine with a plurality of vertical structures (or semiconductor pillars) to constitute three-dimensionally arranged memory cells. In addition, each of the cell array blocks BLK1, BLK2, and BLKn may include bit lines electrically connected to the memory cells.

Figure 3:
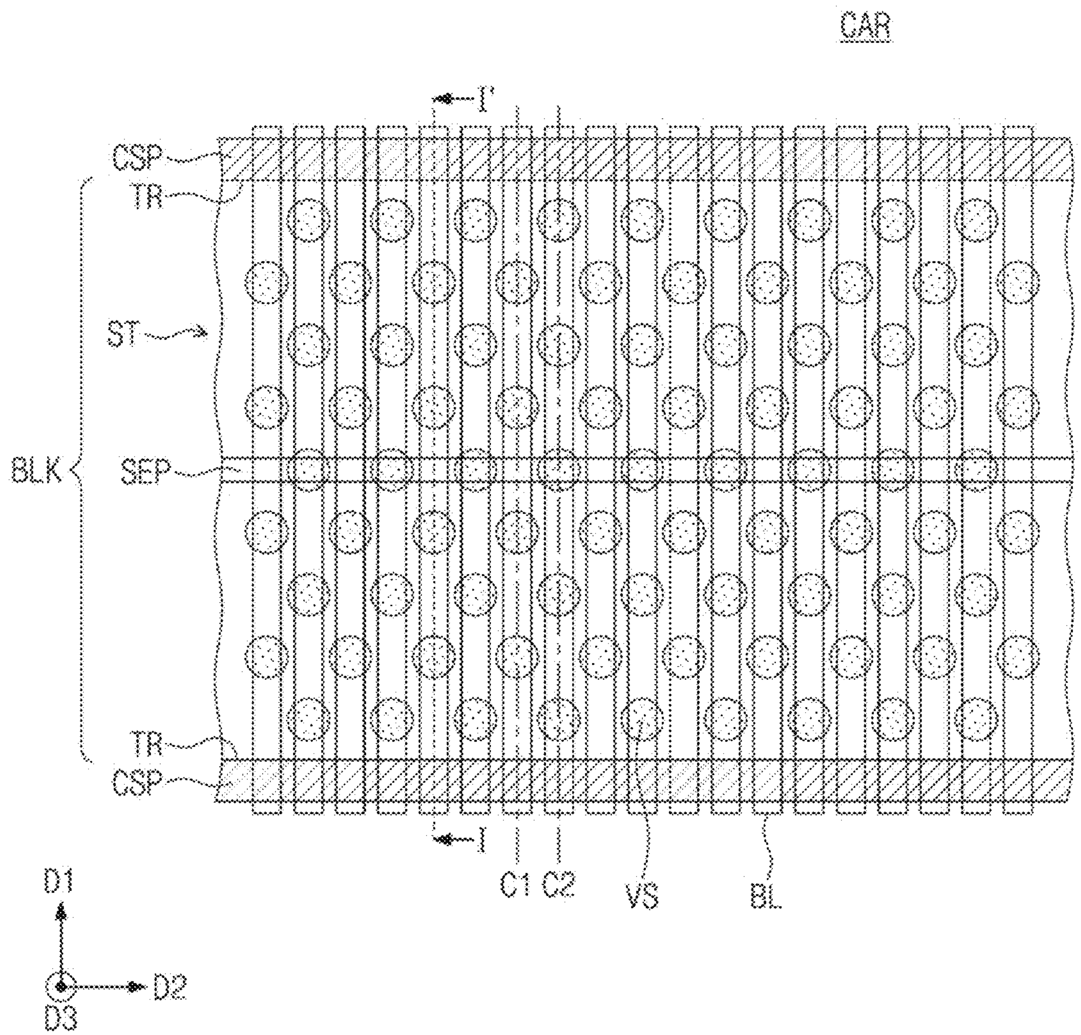
FIG. 3 illustrates a plan view showing a three-dimensional semiconductor memory device according to one or more example embodiments.
Figure 4:
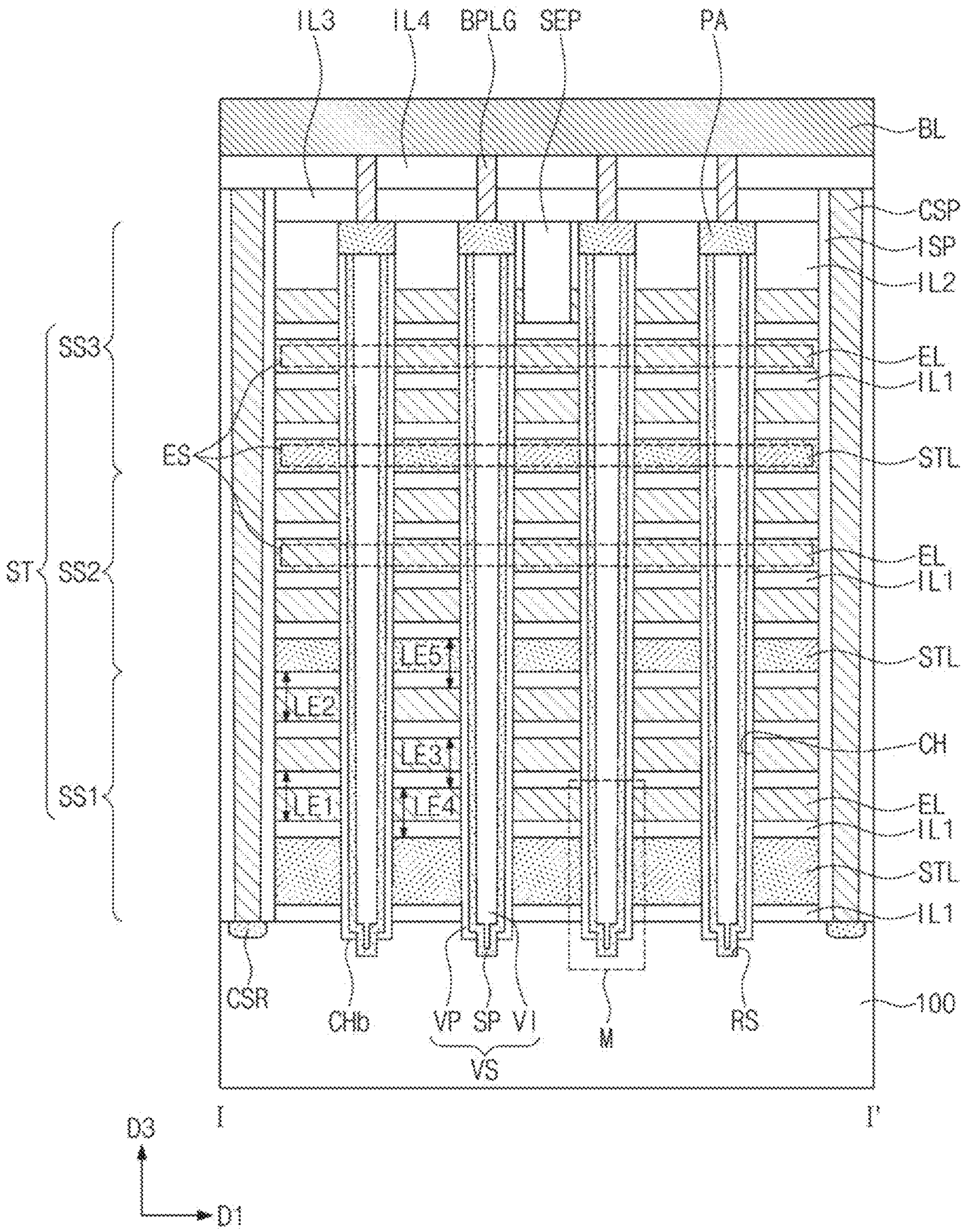
FIG. 4 illustrates a cross-sectional view taken along line I-I' of FIG. 3.
Figure 5:
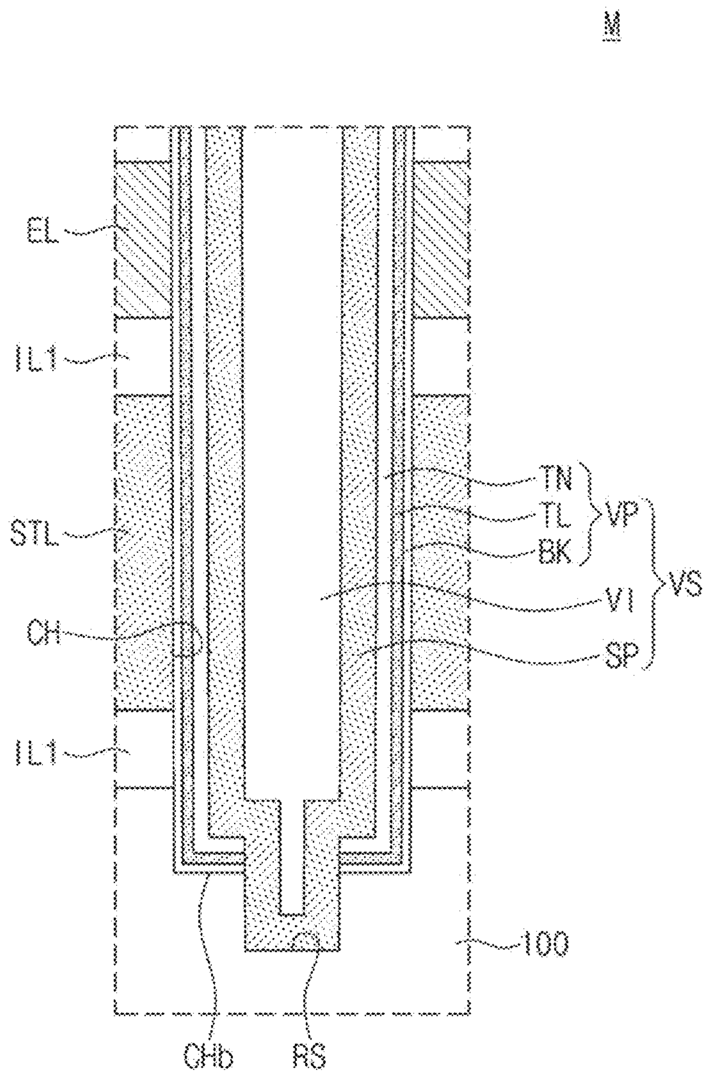
FIG. 5 illustrates an enlarged cross-sectional view showing section M of FIG. 4.

FIG. 3 illustrates a plan view showing a three-dimensional semiconductor memory device according to one or more example embodiments. FIG. 4 illustrates a cross-sectional view taken along line I-I' of FIG. 3. FIG. 5 illustrates an enlarged cross-sectional view showing section M of FIG. 4.

Referring to FIGS. 3, 4, and 5, a substrate 100 may be provided. The substrate 100 may include a cell array region CAR. For example, the substrate 100 may be a silicon substrate, a germanium substrate, or a silicon-germanium substrate. The substrate 100 may have a first conductive type (e.g., p-type).

A cell array block BLK may be disposed on the substrate 100. The cell array block BLK may include a stack structure ST including first dielectric layers IL1 electrodes EL, and stopper layers STL. The stack structure ST may extend along a second direction D2 on the cell array region CAR. A single stack structure ST is illustrated in FIG. 3, but example embodiments are not limited thereto and a plurality of stack structures ST may be provided. The plurality of stack structures ST may be arranged along a first direction D1 intersecting the second direction D2.

Common source regions CSR may be provided on opposite sides of the stack structure ST. The common source regions CSR may be formed in an upper portion of the substrate 100. The common source regions CSR may extend in the second direction D2 parallel to the stack structure ST. The common source regions CSR may be doped with impurities to have a second conductive type. For example, the common source regions CSR may be doped with n-type impurities, such as arsenic (As) or phosphorous (P), to have an n-type conductive type.

A common source plug CSP may be coupled to the common source region CSR. The common source plug CSP may vertically overlap the common source region CSR. The common source plug CSP may extend in the second direction D2 parallel to the stack structures ST. A dielectric spacer ISP may be interposed between the common source plug CSP and the stack structure ST.

The stack structure ST may include a first stack structure SS1, a second stack structure SS2 on the first stack structure SS1, and a third stack structure SS3 on the second stack structure SS2. Each of the first, second, and third stack structures SS1, SS2, and SS3 may include the stopper layer STL and also include the first dielectric layers IL1 and the electrodes EL that are vertically and alternately stacked on the stopper layer STL. In other example embodiments, one or more of the second stack structure SS2 and the third stack structure SS3 may not be provided, and example embodiments are not limited to the configuration shown in FIG. 4.

The electrodes EL of the stack structure ST may be stacked along a third direction D3 perpendicular to a top surface of the substrate 100. The vertically neighboring electrodes EL may be vertically separated from each other by the first dielectric layer IL1 disposed therebetween.

The stack structure ST may include the first dielectric layers IL1 that are stacked spaced apart from each other on the substrate 100. Empty spaces ES may be defined between the first dielectric layers IL1. A single empty space ES may be defined between a pair of neighboring first dielectric layers IL1. Each of the electrode EL and the stopper layer STL may be disposed in a corresponding one of the empty spaces ES.

The stopper layers STL of the first, second, and third stack structures SS1, SS2, and SS3 may have the same thickness as each other or different thicknesses from each other. For example, the stopper layer STL of the first stack structure SS1 may be thicker than the stopper layer STL of the second stack structure SS2. The stopper layer STL of the second stack structure SS2 may have substantially the same thickness as that of the stopper layer STL of the third stack structure SS3. The first stack structure SS1 may further include other first dielectric layer IL1 between the stopper layer STL and the substrate 100.

A lowermost electrode EL of the first stack structure SS1 may be a lower selection line. An uppermost electrode EL of the third stack structure SS3 may be an upper selection line. Other electrodes EL except the lower and upper selection lines may be word lines. A separation dielectric pattern SEP may extend in the second direction D2, while running across the uppermost electrode EL (or the upper selection line). The separation dielectric pattern SEP may include a dielectric material (e.g., a silicon oxide layer).

The stack structure ST may further include a second dielectric layer IL2 on the uppermost electrode EL (or the upper selection line). The second dielectric layer IL2 may be thicker than the first dielectric layers IL1. The second dielectric layer IL2 may have a top surface coplanar with that of the separation dielectric pattern SEP.

The electrodes EL may include a conductive material selected from the group consisting of doped semiconductors (e.g., doped silicon), metals (e.g., tungsten, copper, or aluminum), conductive metal nitrides (e.g., titanium nitride or tantalum nitride), and transition metals (e.g., titanium or tantalum). The first dielectric layers IL1 and the second dielectric layer IL2 may include a silicon oxide layer. The stopper layers STL may include a polysilicon layer.

For example, a first distance LE1 may be provided between bottom surfaces of the electrodes EL included in the first stack structure SS1 A second distance LE2 may be provided between a bottom surface of an uppermost electrode EL included in the first stack structure SS1 and a bottom surface of the stopper layer STL included in the second stack structures SS2. The first distance LE1 and the second distance LE2 may be substantially the same as each other.

A third distance LE3 may be provided between top surfaces of the electrodes EL included in the first stack structure SS1. A fourth distance LE4 may be provided between a top surface of the stopper layer STL included in the first stack structure SS1 and a top surface of the lowermost electrode EL included in the first stack structure SS1. The third distance LE3 and the fourth distance LE4 may be substantially the same as each other. A fifth distance LE5 may be provided between a top surface of the uppermost electrode EL included in the first stack structure SS1 and a top surface of the stopper layer STL included in the second stack structure SS2. The fifth distance LE5 and the second distance LE2 may be substantially the same as each other.

The cell array region CAR may include a plurality of vertical channel structures VS that penetrate the stack structure ST. The vertical channel structures VS may be provided in corresponding channel holes CH of the stack structure ST. For example, a first column C1 may be constituted by four vertical channel structures VS arranged in the first direction D1, and a second column C2 may be constituted by five vertical channel structures VS arranged in the first direction D1. The first column C1 and the second column C2 may be repeatedly and alternately arranged along the second direction D2. Each of the vertical channel structures VS may have a diameter that gradually decreases with decreasing distance from the substrate 100. For example, the vertical channel structures VS may be relatively narrow at locations closer to the substrate 100 and relatively wide at locations farther from the substrate 100.

Each of the vertical channel structures VS may include a vertical dielectric pattern VP, a semiconductor pattern SP, and a buried dielectric pattern VI. The vertical dielectric pattern VP may extend toward the substrate 100 and along an inner wall of the channel hole CH. The semiconductor pattern SP may cover an inner sidewall of the vertical dielectric pattern VP, and may extend together with the vertical dielectric pattern VP toward the substrate 100.

Referring back to FIG. 5, a lower portion of the channel hole CH may extend into the substrate 100. For example, the channel hole CH may have a bottom CHb lower than the top surface of the substrate 100. A recess region RS may be defined by the bottom CHb of the channel hole CH and may extend toward a bottom surface of the substrate 100. A lower portion of the semiconductor pattern SP may fill the recess region RS and may directly contact the substrate 100.

The semiconductor pattern SP may have a pipe shape whose bottom is closed. The buried dielectric pattern VI may fill an inside of the semiconductor pattern SP. The semiconductor pattern SP may be used as a channel of a three-dimensional semiconductor memory device according to one or more example embodiments.

The semiconductor pattern SP may include, for example, silicon (Si), germanium (Ge), or a mixture thereof. The semiconductor pattern SP may have a single crystalline structure, an amorphous structure, a polycrystalline structure, or a combination thereof. The semiconductor pattern SP may be either undoped or doped with impurities to have a first conductive type the same as that of the substrate 100.

The vertical dielectric pattern VP may include a blocking dielectric layer BK, a charge storage layer TL, and a tunnel dielectric layer TN that are interposed between the electrode EL and the semiconductor pattern SP. For example, the blocking dielectric layer BK may be provided on the electrode EL and the first dielectric layer IL1. The blocking dielectric layer BK may cover the electrode EL and the first dielectric layer IL1. The blocking dielectric layer BK may cover the inner wall of the channel hole CH. The charge storage layer TL may be provided on the blocking dielectric layer BK. The tunnel dielectric layer TN may be provided on the charge storage layer TL. The tunnel dielectric layer TN may cover an outer wall of the semiconductor pattern SP. The charge storage layer TL may be interposed between the tunnel dielectric layer TN and the blocking dielectric layer BK.

For example, the blocking dielectric layer BK may include a silicon oxide layer. The charge storage layer TL may include a silicon nitride layer, a silicon oxynitride layer, or a silicon-rich nitride layer. The tunnel dielectric layer TN may include a material whose energy bandgap is greater than that of the charge storage layer TL. The tunnel dielectric layer TN may include either a silicon oxide layer or a high-k dielectric layer, such as an aluminum oxide layer and a hafnium oxide layer.

A NAND Flash memory device may be adopted as a three-dimensional semiconductor memory device according to one or more example embodiments. The charge storage layer TL between the electrode EL and the semiconductor pattern SP may be a data storage region of the NAND Flash memory device. Data stored in the data storage layer TL may be changed by Fouler-Nordheim tunneling induced by a voltage difference between the electrode EL and the semiconductor pattern SP.

The lower portion of the semiconductor pattern SP may penetrate the blocking dielectric layer BK, the charge storage layer TL, and the tunnel dielectric layer TN of the vertical dielectric pattern VP, contacting the substrate 100. The vertical dielectric pattern VP may not fill the recess region RS that extends downwardly from the bottom CHb of the channel hole CH.

Referring again to FIGS. 3, 4, and 5, a conductive pad PA may be provided on each of the vertical channel structures VS. The conductive pad PA may cover a top surface of each of the vertical dielectric pattern VP, the semiconductor pattern SP, and the buried dielectric pattern VI. The conductive pad PA may include one or more of an impurity-doped semiconductor material and a conductive material. The conductive pad PA may have a top surface coplanar with that of the second dielectric layer IL2. A bit line plug BPLG may be electrically connected to the semiconductor pattern SP through the conductive pad PA.

A third dielectric layer IL3 and a fourth dielectric layer IL4 may be sequentially stacked on the stack structure ST. Bit lines BL that extend in the first direction D1 may be provided on the fourth dielectric layer IL4. The bit line BL and the pads PA may be provided therebetween with bit line contact plugs BPLG that penetrate the fourth dielectric layer IL4 and the third dielectric layer IL3. The bit line BL may be electrically connected through the bit line contact plug BPLG to the vertical channel structure VS.

A semiconductor memory device according to one or more example embodiments may be configured such that the bottoms CHb of the channel holes CH filled with the vertical channel structures VS may be located at similar levels to each other. For example, even when a height of the stack structure ST becomes larger, the bottoms CHb of the channel holes CH may all be disposed at similar levels to each other, while being positioned lower than the top surface of the substrate 100. In such configurations, it may be possible to avoid process defects that at least one of the vertical channel structures VS is not electrically connected to the substrate 100, thereby improving reliability.

FIGS. 6 to 15 illustrate a method of fabricating a three-dimensional semiconductor memory device according to one or more example embodiments. For example, FIGS. 6 to 15 may represent cross-sectional views taken along line I-I' of FIG. 3.

Figure 6:
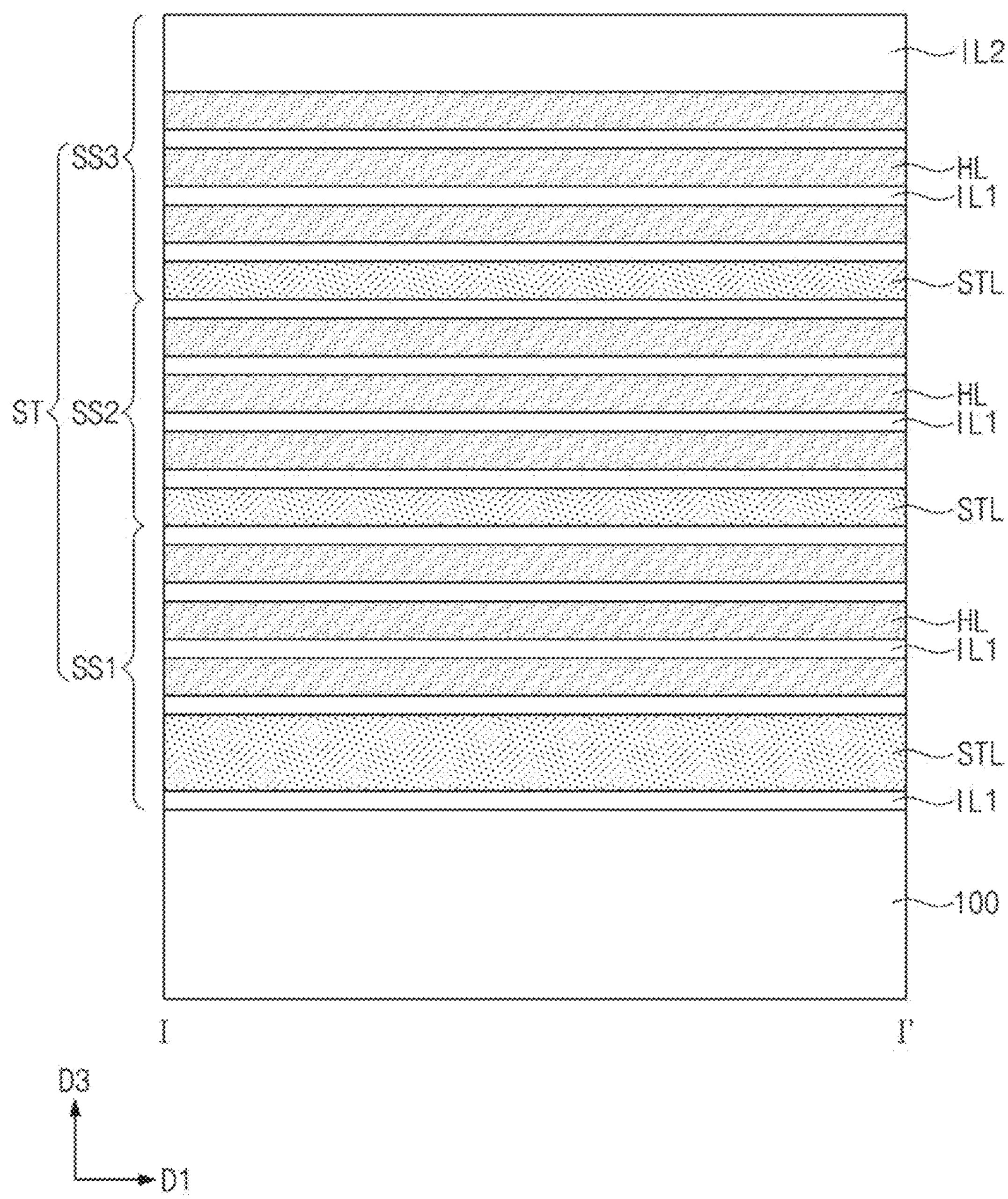
FIGS. 6 to 15 illustrate a method of fabricating a three-dimensional semiconductor memory device according to one or more example embodiments.

Referring to FIGS. 3 and 6, first dielectric layers IL1 and sacrificial layers HL may be vertically and alternately stacked on an entire surface of a substrate 100, which may result in the formation of a stack structure ST. The substrate 100 may be a silicon substrate, a germanium substrate, or a silicon-germanium substrate. The stack structure ST may include first, second, and third stack structures SS1, SS2, and SS3 that are sequentially stacked.

For example, the formation of the first stack structure SS1 may include forming the first dielectric layer IL1 on the entire surface of the substrate 100, forming a stopper layer STL on the first dielectric layer IL1, and vertically and alternately stacking the first dielectric layers IL1 and the sacrificial layers HL on the stopper layer STL. The formation of the second stack structure SS2 may include forming a stopper layer STL on the first stack structure SS1, and vertically and alternately stacking the first dielectric layers IL1 and the sacrificial layers HL on the stopper layer STL. The formation of the third stack structure SS3 may include forming a stopper layer STL on the second stack structure SS2, vertically and alternately stacking the first dielectric layers IL1 and the sacrificial layers HL on the stopper layer STL, and forming a second dielectric layer IL2 on an uppermost sacrificial layer HL.

The stopper layers STL, the first dielectric layers ILL the second dielectric layer IL2, and the sacrificial layers HL may be deposited using thermal chemical vapor deposition (CVD), plasma enhanced CVD, physical CVD, or atomic layer deposition (ALD). The stopper layers STL may be formed of a polysilicon layer, the first dielectric layers IL1 and the second dielectric layer IL2 may be formed of a silicon oxide layer, and the sacrificial layers HL may be formed of a silicon nitride layer or a silicon oxynitride layer.

Figure 7:
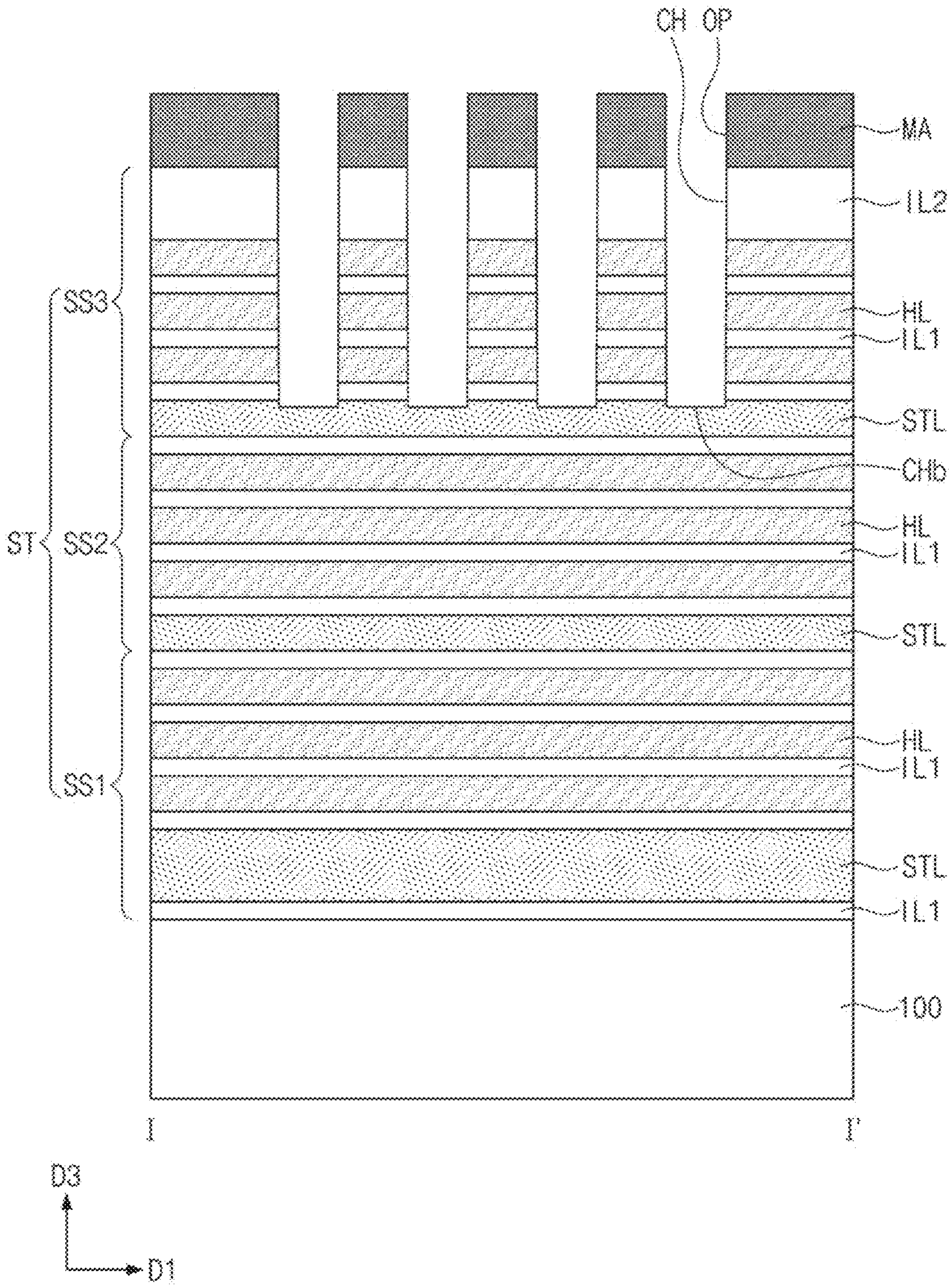

Referring to FIGS. 3 and 7, an upper portion of the stack structure ST may be patterned to form channel holes CH. For example, the formation of the channel holes CH may include forming, on the stack structure ST, a mask pattern MA having openings OP that define regions where the channel holes CH are formed, and performing an etching process in which the mask pattern MA is used as an etching mask to anisotropically etch the stack structure ST.

The etching process to form the channel holes CH may first be performed using a first etch recipe that is capable of selectively etching the first and second dielectric layers IL1 and IL2 and the sacrificial layers HL. Therefore, the etching action may stop at the stopper layer STL of the third stack structure SS3. The channel holes CH may have their bottoms CHb located at substantially the same level in the stopper layer STL of the third stack structure SS3.

Figure 8:
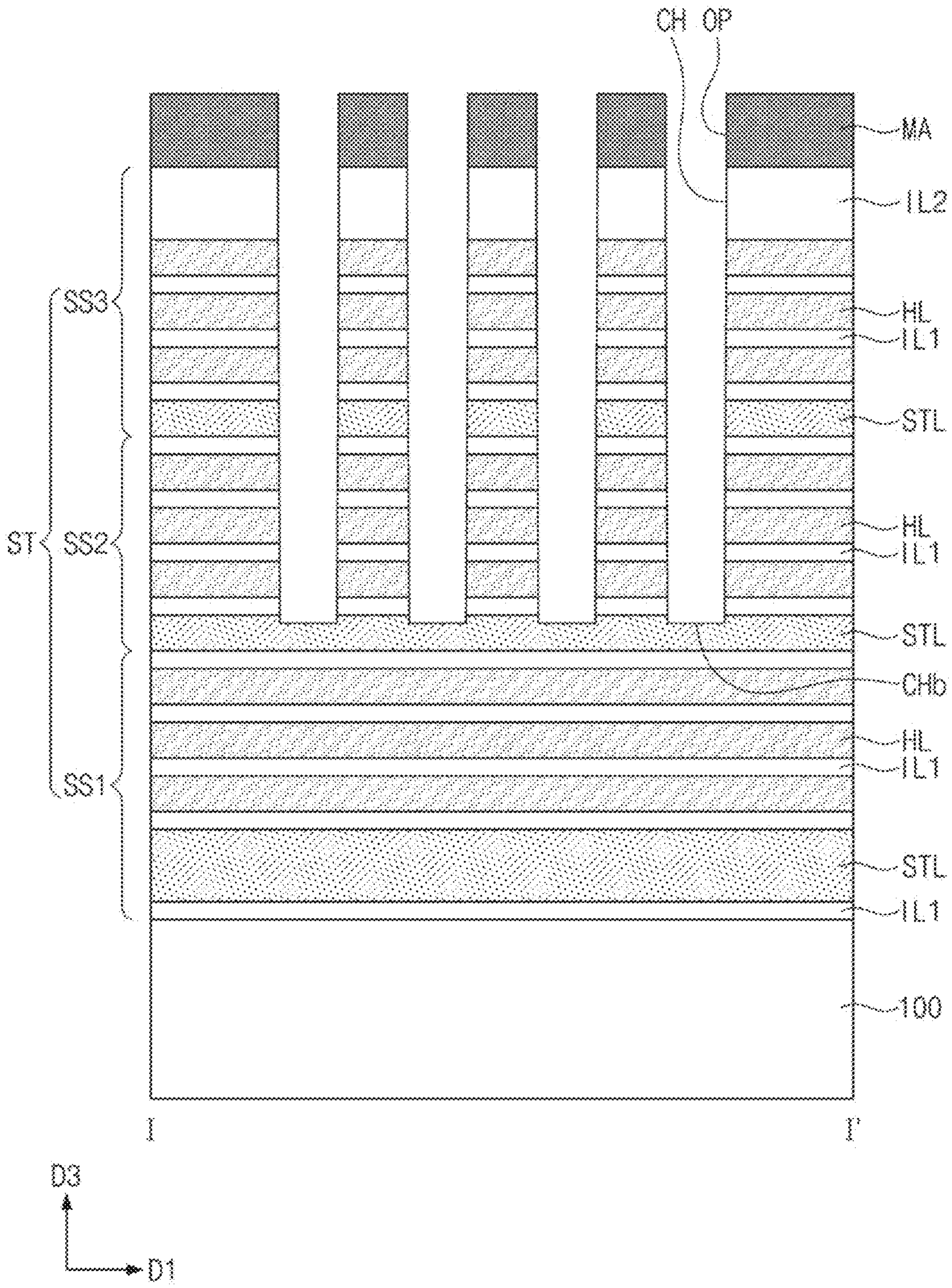

Referring to FIGS. 3 and 8, the etching process to form the channel holes CH may be performed using a second etch recipe that is capable of selectively etching the stopper layer STL. Thus, the channel holes CH may penetrate the stopper layer STL of the third stack structure SS3. Afterwards, the etching process to form the channel holes CH may be performed again using the first etch recipe. Hence, the etching action may stop at the stopper layer STL of the second stack structure SS2. The bottoms CHb of the channel holes CH may be located at substantially the same level in the stopper layer STL of the second stack structure SS2.

Figure 9:
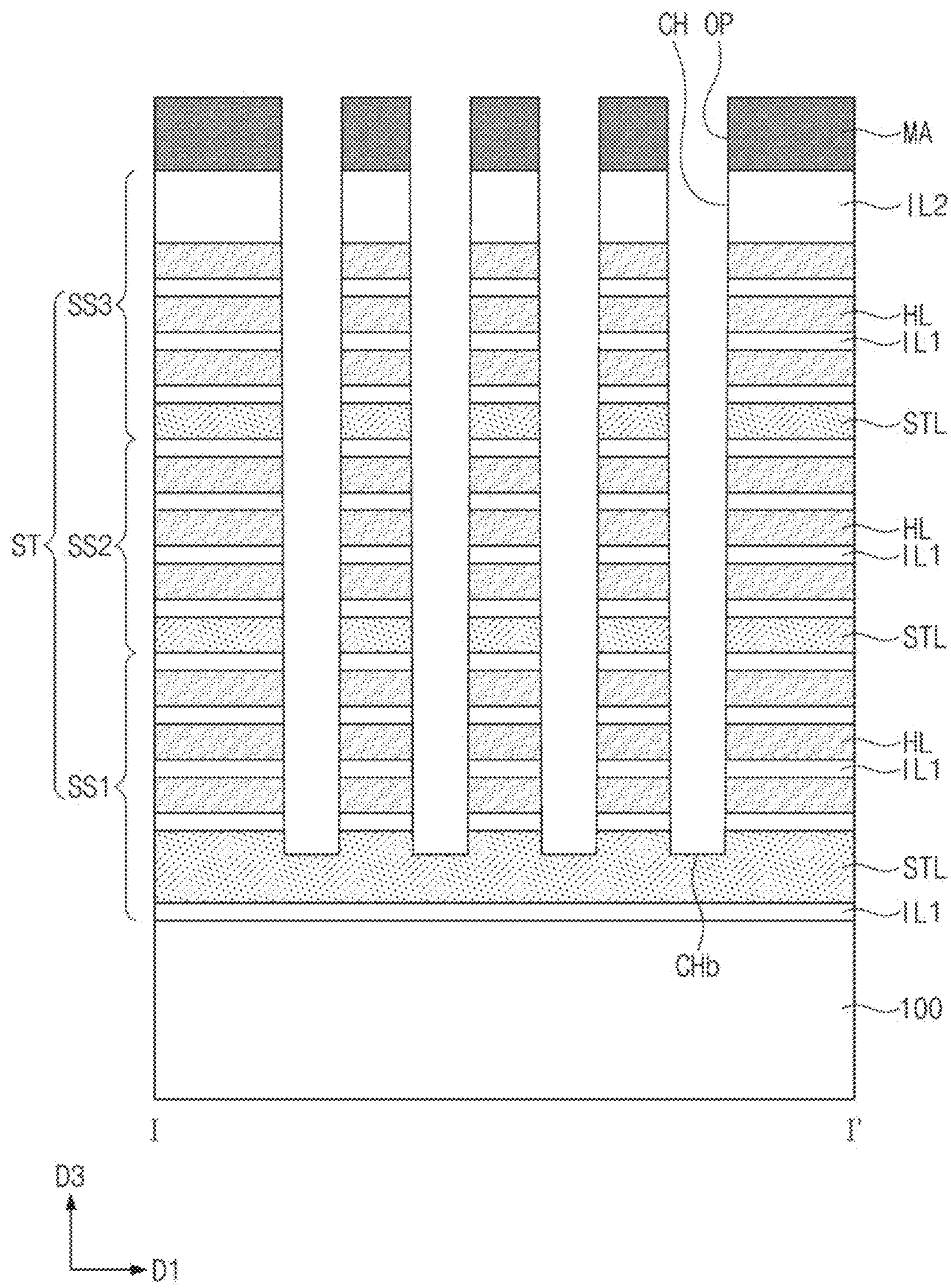

Referring to FIGS. 3 and 9, the etching process to form the channel holes CH may be performed using the second etch recipe. Therefore, the channel holes CH may penetrate the stopper layer STL of the second stack structure SS2. Thereafter, the etching process to form the channel holes CH may be performed again using the first etch recipe. Hence, the etching action may stop at the stopper layer STL of the first stack structure SS1. The bottoms CHb of the channel holes CH may be located at substantially the same level in the stopper layer STL of the first stack structure SS1.

Figure 10:
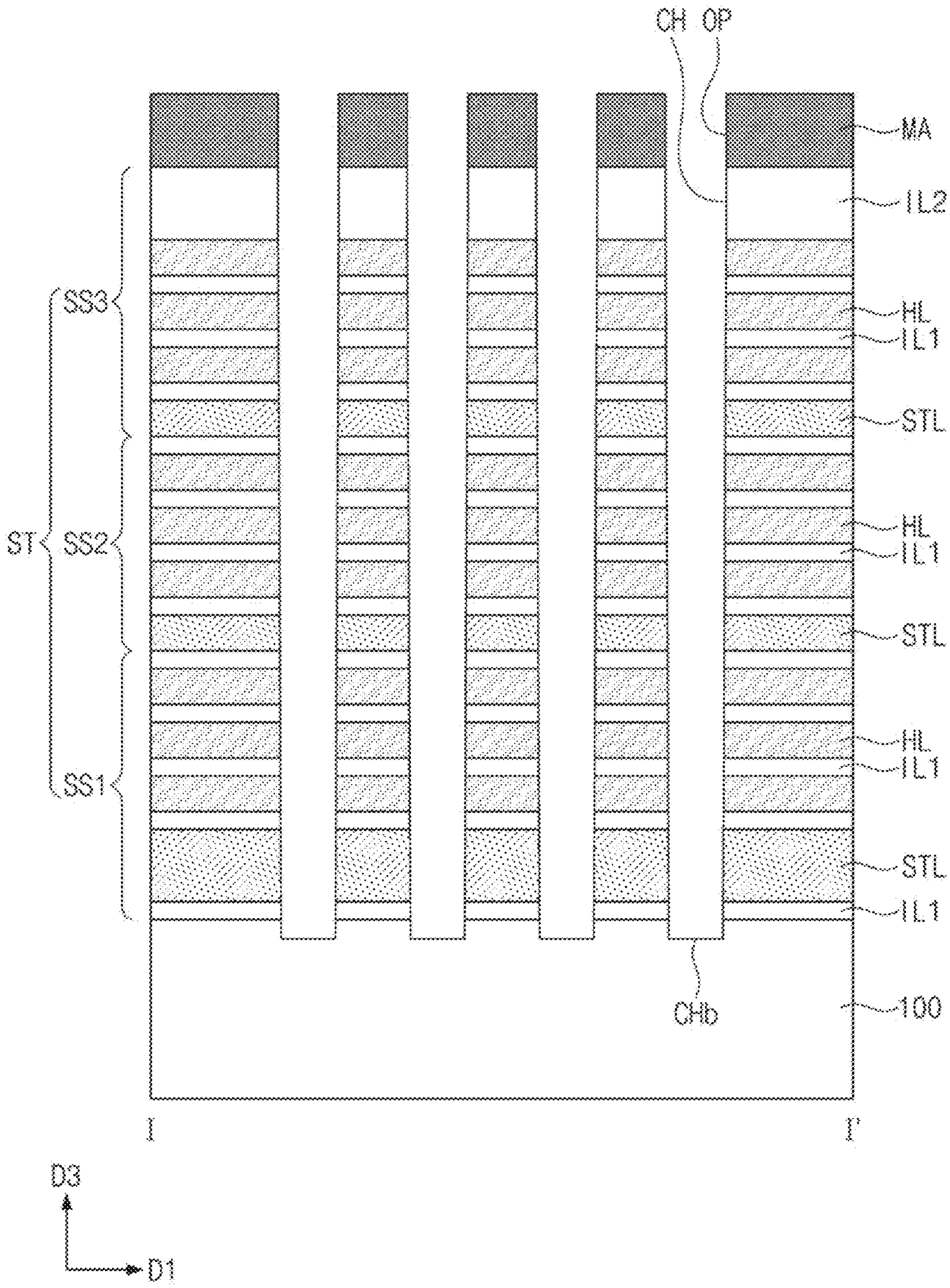

Referring to FIG. 10, the etching process to form the channel holes CH may be performed using the second etch recipe. Thus, the channel holes CH may penetrate the stopper layer STL of the first stack structure SS1. The channel holes CH may be over-etched to extend into the substrate 100. The bottoms CHb of the channel holes CH may be lower than a top surface of the substrate 100. The bottoms CHb of the channel holes CH may be located at substantially the same level in the substrate 100.

In an example embodiment, the etching process to form the channel holes CH discussed above with reference to FIGS. 7 to 10 may be successively performed in a single step in one etching apparatus. For example, the channel holes CH may eventually be formed in a single etching process whose etch recipe is changed based on the progress of the etching process in the same etching apparatus.

Figure 11:
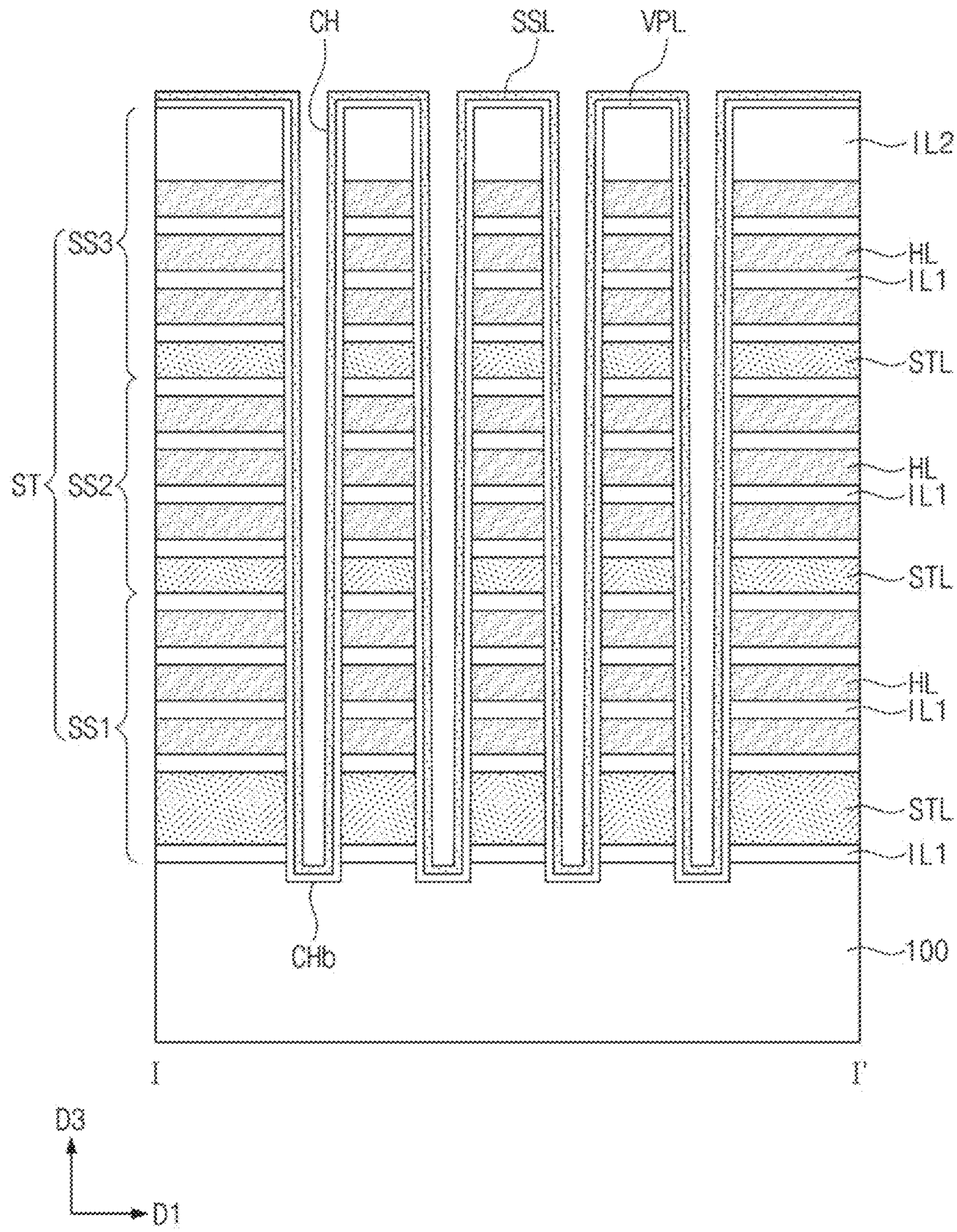

Referring to FIGS. 3 and 11, the mask pattern MA may be selectively removed. A vertical dielectric layer VPL and a sacrificial semiconductor layer SSL may be sequentially formed in the channel holes CH. For example, the formation of the vertical dielectric layer VPL may include conformally forming a blocking dielectric layer on an inner wall of each of the channel holes CH, conformally forming a charge storage layer on the blocking dielectric layer, and conformally forming a tunnel dielectric layer on the charge storage layer. The vertical dielectric layer VPL may cover the bottom CHb of each of the channel holes CH.

For example, the blocking dielectric layer may include a silicon oxide layer. The charge storage layer may include a silicon nitride layer, a silicon oxynitride layer, or a silicon-rich nitride layer. The tunnel dielectric layer may include either a silicon oxide layer or a high-k dielectric layer such as an aluminum oxide layer and a hafnium oxide layer. The blocking dielectric layer, the charge storage layer, and the tunnel dielectric layer may be formed using atomic layer deposition (ALD) or chemical vapor deposition (CVD).

The sacrificial semiconductor layer SSL may be conformally formed on the vertical dielectric layer VPL in each of the channel holes CH. For example, the sacrificial semiconductor layer SSL may include silicon (Si), germanium (Ge), or a mixture thereof. The sacrificial semiconductor layer SSL may be formed using atomic layer deposition (ALD) or chemical vapor deposition (CVD).

Figure 12:
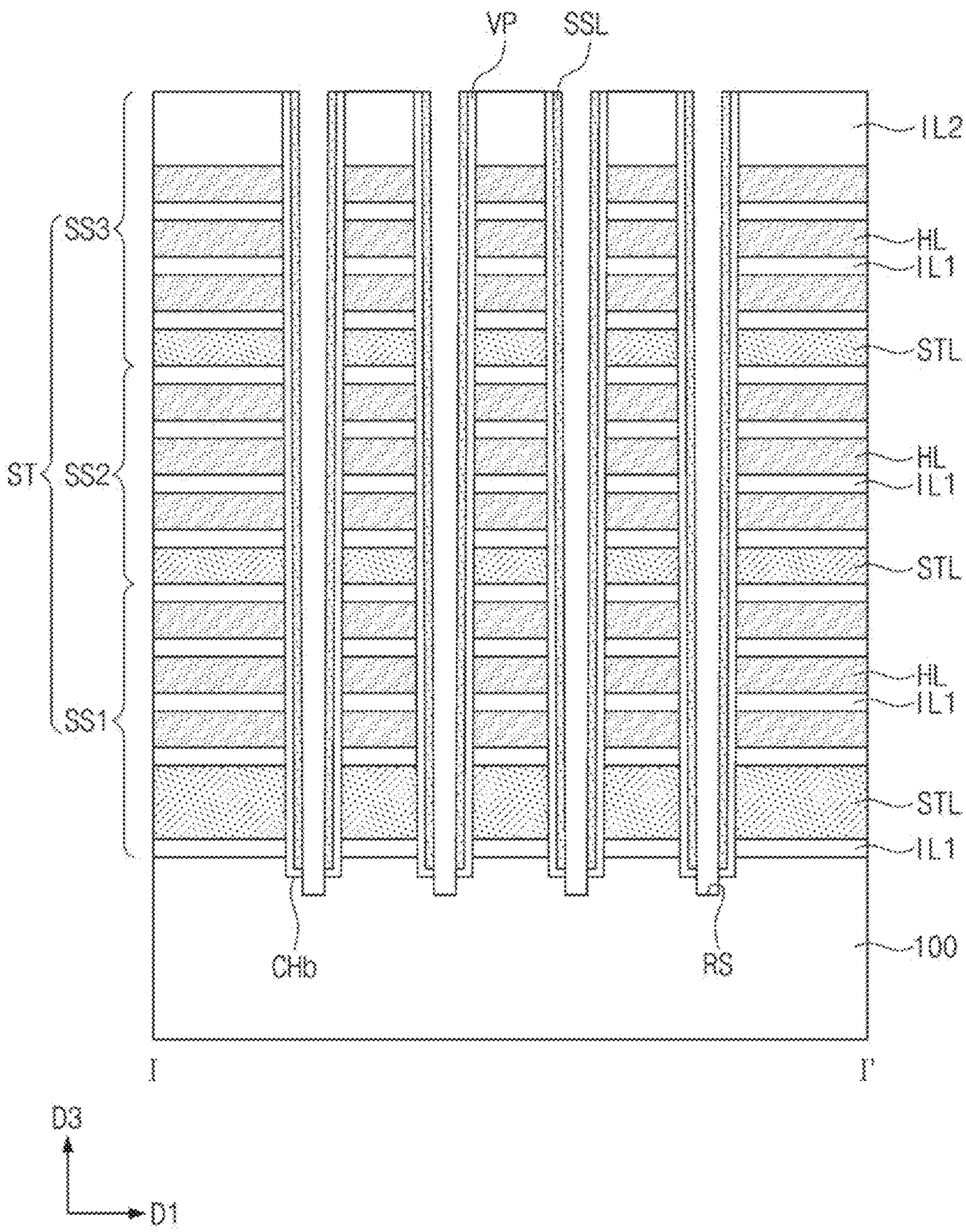

Referring to FIGS. 3 and 12, the entire surface of the substrate 100 may undergo an anisotropic etching process to form recess regions RS each of which extends from the bottom CHb of the channel hole CH toward a bottom surface of the substrate 100.

The anisotropic etching process may use the sacrificial semiconductor layer SSL on the inner wall of the channel hole CH as an etching mask to etch the vertical dielectric layer VPL and the sacrificial semiconductor layer SSL on the bottom CHb of the channel hole CH. The anisotropic etching process may be executed until an upper portion of the substrate 100 is over-etched to form the recess regions RS.

During the anisotropic etching process, the vertical dielectric layer VPL may be removed from the bottom CHb of the channel hole CH, such that a vertical dielectric pattern VP may be formed to cover the inner wall of the channel hole CH. The recess regions RS and the channel holes CH may expose the substrate 100.

Figure 13:
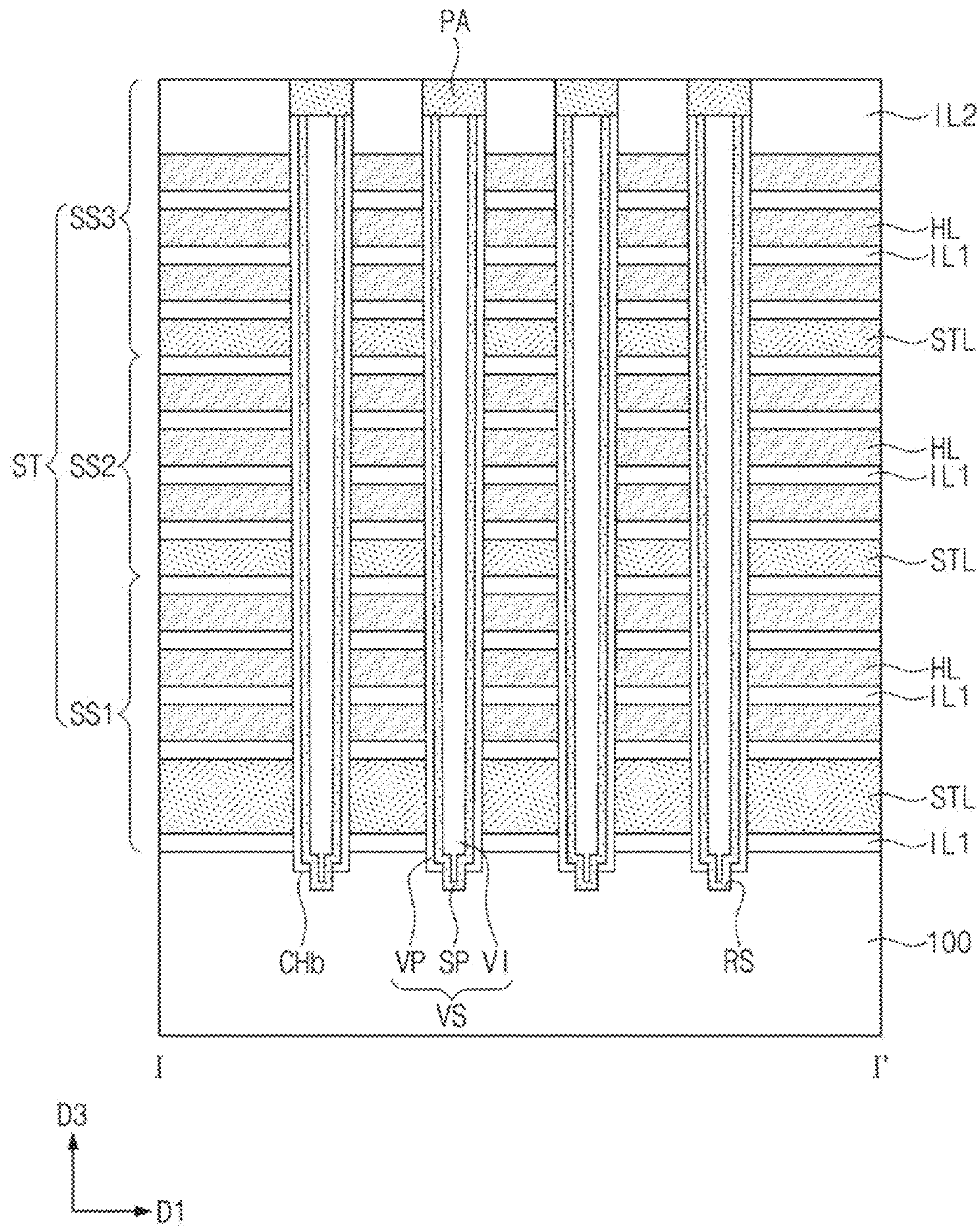

Referring to FIGS. 3 and 13, the sacrificial semiconductor layer SSL may be selectively removed. After that, a semiconductor pattern SP may be formed in each of the channel holes CH. A lower portion of the semiconductor pattern SP may fill the recess region RS. The lower portion of the semiconductor pattern SP may directly contact the substrate 100.

The semiconductor pattern SP may be conformally formed on the vertical dielectric pattern VP in each of the channel holes CH. For example, the semiconductor pattern SP may include silicon (Si), germanium (Ge), or a mixture thereof. The semiconductor pattern SP may be formed using atomic layer deposition (ALD) or chemical vapor deposition (CVD).

A buried dielectric pattern VI may be formed to completely fill each of the channel holes CH. A vertical channel structure VS may be constituted by the vertical dielectric pattern VP, the semiconductor pattern SP, and the buried dielectric pattern VI that are formed in each of the channel holes CH. A conductive pad PA may be formed on an upper portion of each of the channel hole CH. The conductive pad PA may be formed on the vertical channel structure VS.

Figure 14:
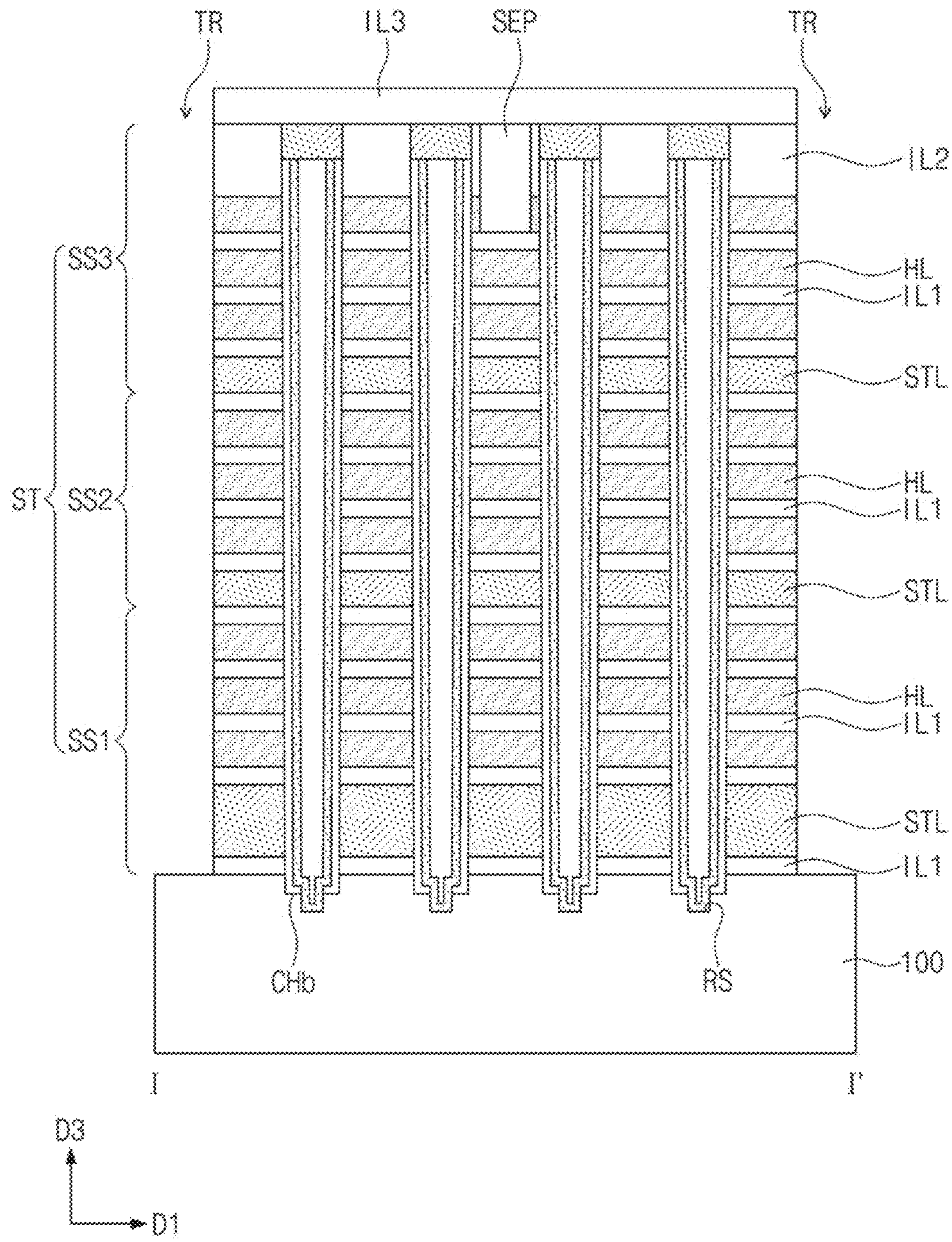

Referring to FIGS. 3 and 14, a separation dielectric pattern SEP may be formed in an upper portion of the stack structure ST. The separation dielectric pattern SEP may be formed to extend in a second direction D2. For example, the formation of the separation dielectric pattern SEP may include forming a recess by etching the second dielectric layer IL2 and an uppermost sacrificial layer HL, and filling the recess with a dielectric layer.

A third dielectric layer IL3 may be formed on the stack structure ST. The third dielectric layer IL3 may cover the conductive pads PA and the separation dielectric pattern SEP. The third dielectric layer IL3 and the stack structure ST may be patterned to form trenches TR that penetrate the stack structure ST. The trenches TR may partially expose the substrate 100. The trenches TR may extend in the second direction D2 along the stack structure ST.

Figure 15:
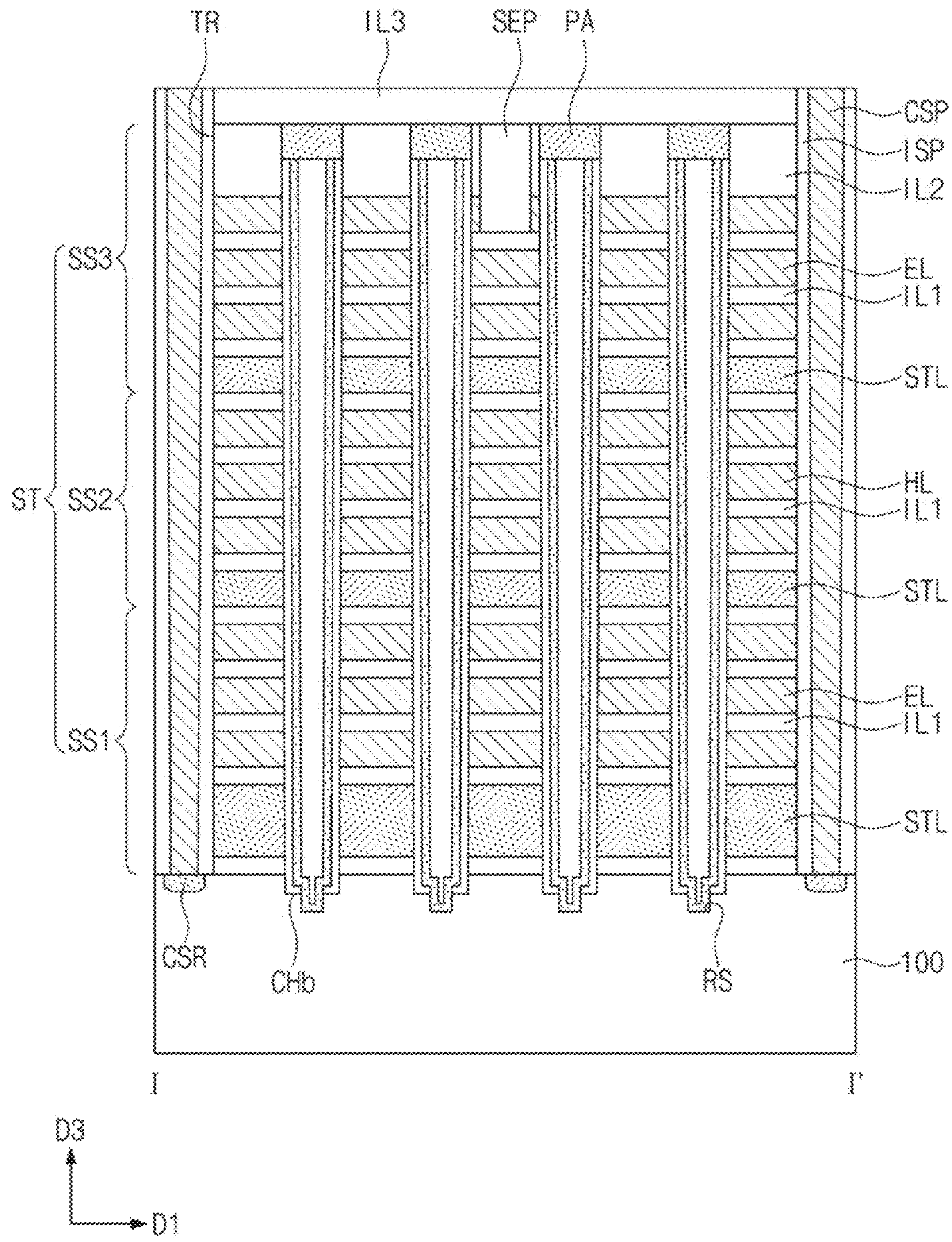

Referring to FIGS. 3 and 15, the sacrificial layers HL may be correspondingly replaced with electrodes EL. For example, the sacrificial layers HL exposed to the trenches TR may be selectively removed to form empty spaces. The removal of the sacrificial layers HL may use a wet etching process that is capable of selectively etching the sacrificial layers HL. A conductive material may be deposited on the substrate 100 to fill the empty spaces where the sacrificial layers HL are removed. The conductive material may be selected from the group consisting of doped semiconductors, metals, and transition metals. The electrode EL may be formed from the conductive material that fills the empty space.

The substrate 100 exposed to the trenches TR may be doped with impurities to form common source regions CSR. A dielectric spacer ISP and a common source plug CSP may be formed to sequentially fill each of the trenches TR. The common source plug CSP may be coupled to the common source region CSR.

Referring FIGS. 3 and 4, a fourth dielectric layer IL4 may be formed on the third dielectric layer IL3. Bit line contact plugs BPLG may be formed to penetrate the third and fourth dielectric layers IL3 and IL4 and to have connection with corresponding vertical channel structures VS. On the fourth dielectric layer IL4, bit lines BL may be formed to have electrical connection with the bit line contact plugs BPLG.

A fabrication method according to one or more example embodiments may use a plurality of stopper layers STL to form the channel holes CH whose bottoms CHb are located at the same level.

For example, during the etching process to form the channel holes CH, the bottoms CHb of the channel holes CH may descend downwardly toward the substrate 100. At this stage, the channel holes CH may have different etching degrees from each other, and thus the bottoms CHb of the channel holes CH may be located at different levels from each other. For example, during the etching process, the bottoms CHb of the channel holes CH may downwardly move at different speeds toward the substrate 100.

According to one or more example embodiments, the stopper layer STL may serve to allow the bottoms CHb of the channel holes CH to coincide with each other, and then the etching process may be performed again. Accordingly, even when a height of the stack structure ST becomes larger, the bottoms CHb of the channel holes CH may be finally located at substantially the same level. Therefore, an etching variation of the channel holes CH may be improved according to one or more example embodiments. Further, it is not required that the lower portion of the channel hole CH be filled with a semiconductor epitaxial pattern grown from the substrate 100 (or, it is not needed to separately perform a selective epitaxial growth process). As a result, it may be possible to simplify methods of fabricating semiconductor devices and to cut costs in fabricating semiconductor devices.

FIGS. 16 to 21 illustrate cross-sectional views taken along line I-I' of FIG. 3, showing a three-dimensional semiconductor memory device according to example embodiments. In the example embodiments that follow, a detailed description of technical features repetitive to those discussed above with reference to FIGS. 3, 4, and 5 will be omitted, and a difference thereof will be discussed in detail.

Figure 16:
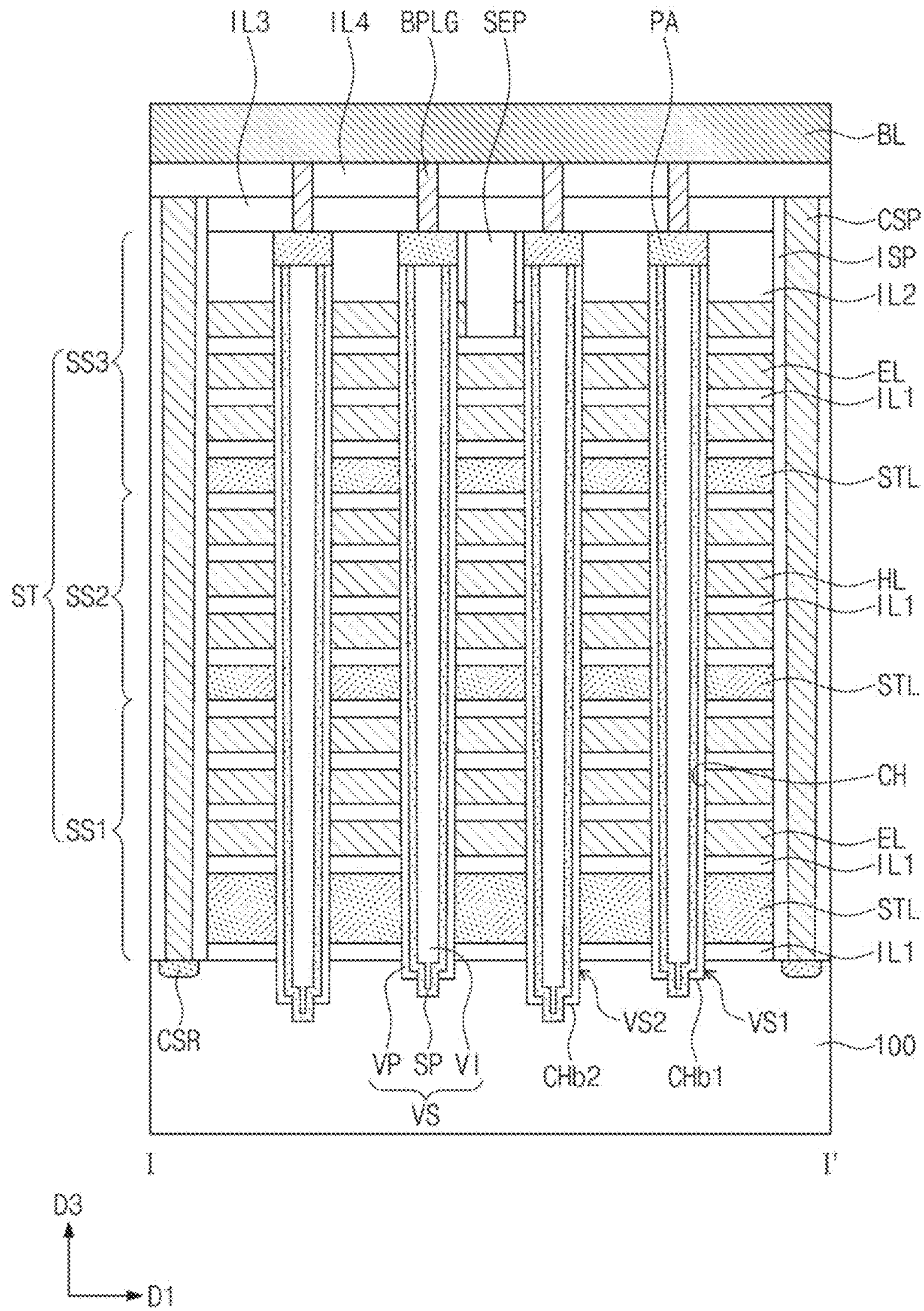
FIGS. 16 to 21 illustrate cross-sectional views taken along line I-I' of FIG. 3, showing a three-dimensional semiconductor memory device according to one or more example embodiments.

According to an example embodiment, referring to FIGS. 3 and 16, the bottoms CHb of the channel holes CH in which the vertical channel structures VS are provided may be located at different levels from each other. For example, the vertical channel structures VS may include a first vertical channel structure VS1 and a second vertical channel structure VS2 adjacent to the first vertical channel structure VS1. A bottom CHb1 of the channel hole CH provided within the first vertical channel structure VS1 and a bottom CHb2 of the channel hole CH provided within the second vertical channel structure VS2 may all be lower than the top surface of the substrate 100. The bottom CHb2 of the channel hole CH provided within the second vertical channel structure VS2 may be lower than the bottom CHb1 of the channel hole CH provided within the first vertical channel structure VS1.

Figure 17:
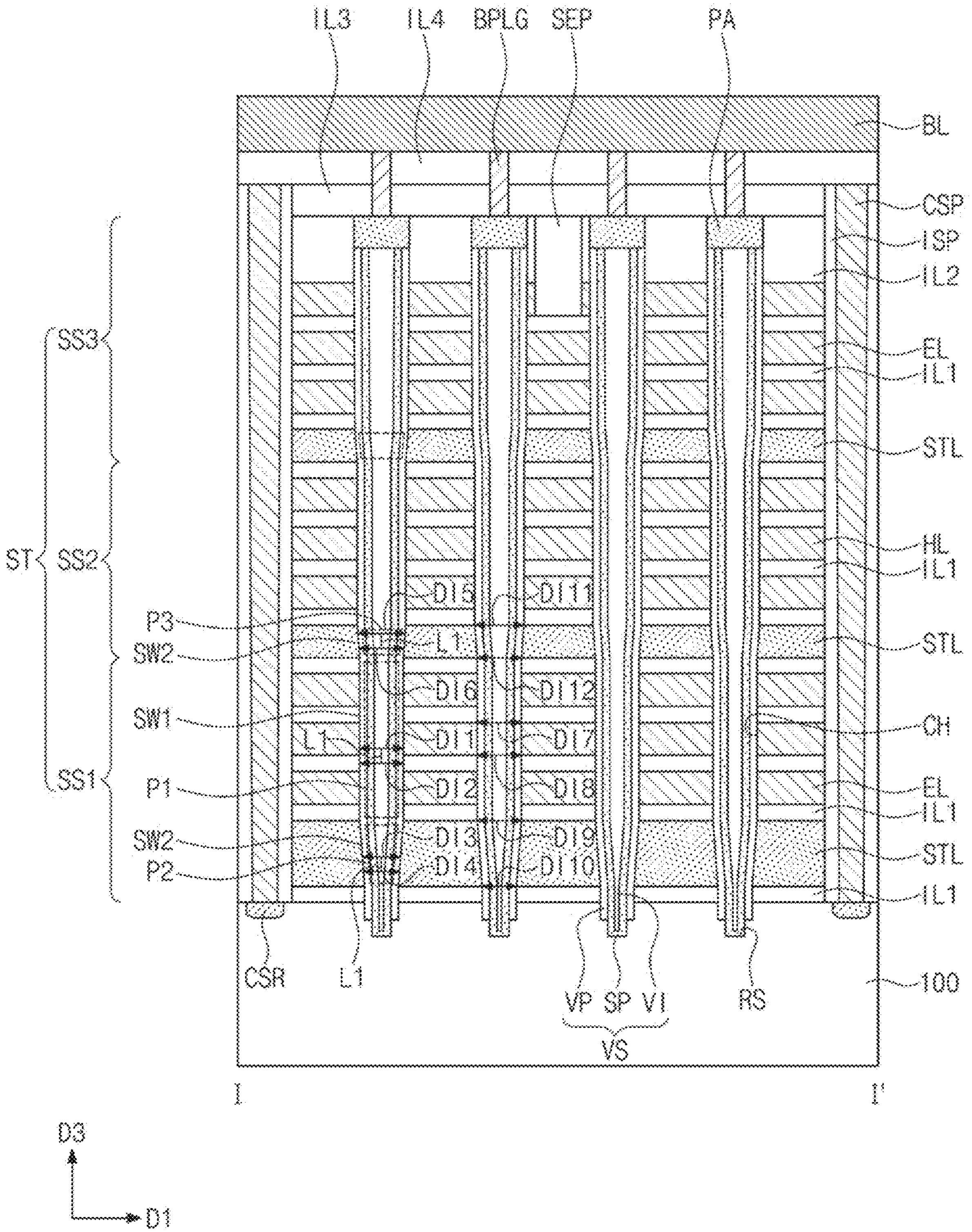

According to an example embodiment, referring to FIGS. 3 and 17, each of the vertical channel structures VS may include a first part P1, a second part P2, and a third part P3. For example, the first part P1 may be a portion of the vertical channel structure VS that penetrates the first dielectric layers IL1 and the electrodes EL of the first stack structure SS1 that are above the stopper layer STL of the first stack structure SS1. The second part P2 may be a portion of the vertical channel structure VS that penetrates the stopper layer STL of the first stack structure SS1. For example, the second part P2 may be located at the same level as that of the stopper layer STL of the first stack structure SS1. The third part P3 may be a portion of the vertical channel structure VS that penetrates the stopper layer STL of the second stack structure SS2. For example, the third part P3 may be located at the same level as that of the stopper layer STL of the second stack structure SS2. The first part P1 may be interposed between the second part P2 and the third part P3.

The first part P1 may have a first sidewall SW1, and the second part P2 may have a second sidewall SW2. The first sidewall SW1 may be steeper than the second sidewall SW2. The first sidewall SW1 may be more perpendicular to the substrate 100 than the second sidewall SW2.

The diameter of the first part P1 may change at a rate that is less than the rate of change of the diameter of the second part P2. For example, the first part P1 may have a first diameter DI1 at a segment and a second diameter DI2 at another segment downwardly spaced apart at a first length L1 from the segment having the first diameter DI1. The rate of change in diameter of the first part P1 may be a difference between the first diameter DI1 and the second diameter DI2 with respect to the first length L1 (or (DI1−DI2)/L1). The second part P2 may have a third diameter DI3 at a segment and a fourth diameter DI4 at another segment downwardly spaced apart at the first length L1 from the segment having the third diameter DI3. A rate of change in diameter of the second part P2 may be a difference between the third diameter DI3 and the fourth diameter DI4 with respect to the first length L1 (or (DI3−DI4)/L1). Because the first sidewall SW1 is steeper than the second sidewall SW2, the change in diameter of the first part P1 may be less than the change in diameter of the second part P2.

The third part P3 may have a fifth diameter DI5 at a segment and a sixth diameter DI6 at another segment downwardly spaced apart at the first length L1 from the segment having the fifth diameter DI5. A rate of change in diameter of the third part P3 may be a difference between the fifth diameter DI5 and the sixth diameter DI6 with respect to the first length L1 (or (DI5−DI6)/L1). The rate of change in diameter of the first part P1 may be less than the rate of change in diameter of the third part P3. The rate of change in diameter of the second part P2 may be the same as or different from the rate of change in diameter of the third part P3.

The first length L1 may be a fixed distance that is used when comparing the rate of change in diameter between the first, second, and third parts P1, P2, and P3. For example, the first length L1 may be defined as a value less than a thickness of the stopper layer STL included in the second stack structure SS2.

The first part P1 of the vertical channel structure VS may have a seventh diameter DI7 at a top surface of one of the electrodes EL through which the first part P1 penetrates. The first part P1 may have an eighth diameter DI8 at a bottom surface of the one electrode EL. The second part P2 of the vertical channel structure VS may have a ninth diameter DI9 at a top surface of the stopper layer STL included in the first stack structure SS1. The second part P2 may have a tenth diameter DI10 at a bottom surface of the stopper layer STL included in the first stack structure SS1. The third part P3 of the vertical channel structure VS may have an eleventh diameter DI11 at a top surface of the stopper layer STL included in the second stack structure SS2. The third part P3 may have a twelfth diameter DI12 at a bottom surface of the stopper layer STL included in the second stack structure SS2.

A difference (or DI9−DI10) between the ninth and tenth diameters DI9 and DI10 of the second part P2 may be greater than a difference (or DI7−D18) between the seventh and eighth diameters DI7 and DI8 of the first part P1. A difference (or DI11−DI12) between the eleventh and twelfth diameters DI11 and DI12 of the third part P3 may be greater than the difference (or DI7−D18) between the seventh and eighth diameters DI7 and DI8 of the first part P1. The difference (or DI9−DI10) between the ninth and tenth diameters DI9 and DI10 of the second part P2 may be the same as or different from the difference (or DI11−DI2) between the eleventh and twelfth diameters DI11 and DI12 of the third part P3.

Figure 18:
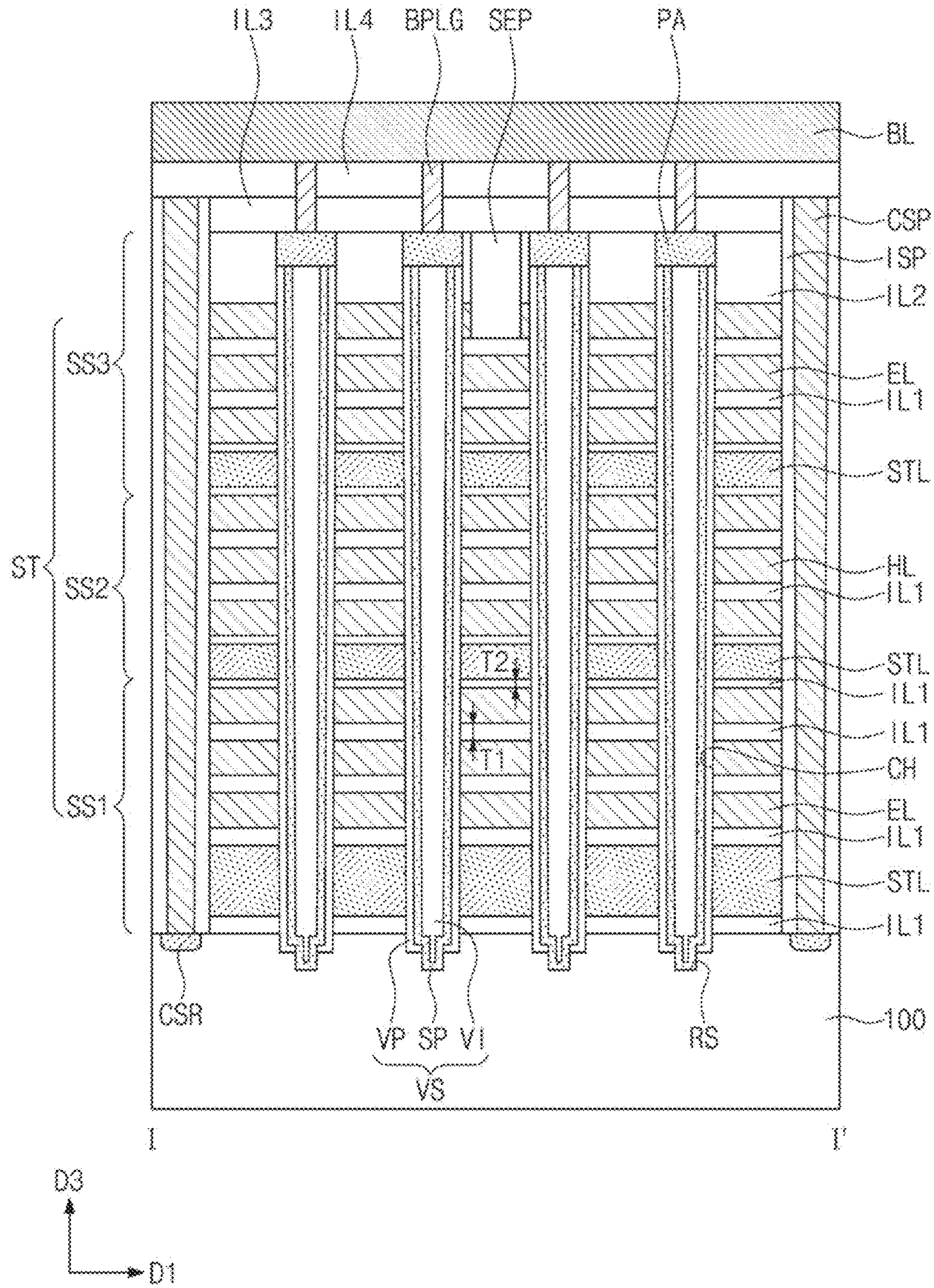

According to an example embodiment, referring to FIGS. 3 and 18, the first dielectric layers IL1 may have different thicknesses from each other. For example, a first thickness T1 may be given to the first dielectric layer IL1 interposed between the electrodes EL that are vertically adjacent to each other. A second thickness T2 may be given to the first dielectric layer IL1 interposed between the stopper layer STL and the electrode EL adjacent thereto. The second thickness T2 may be less than the first thickness T1.

The electrodes EL, which are disposed above and below the stopper layer STL, may be spaced apart at a sufficient distance from each other across the stopper layer STL therebetween. Therefore, the first dielectric layer IL1 between the electrodes EL may be formed to have a relatively small thickness. As a result, the stack structure ST may decrease in height.

Figure 19:
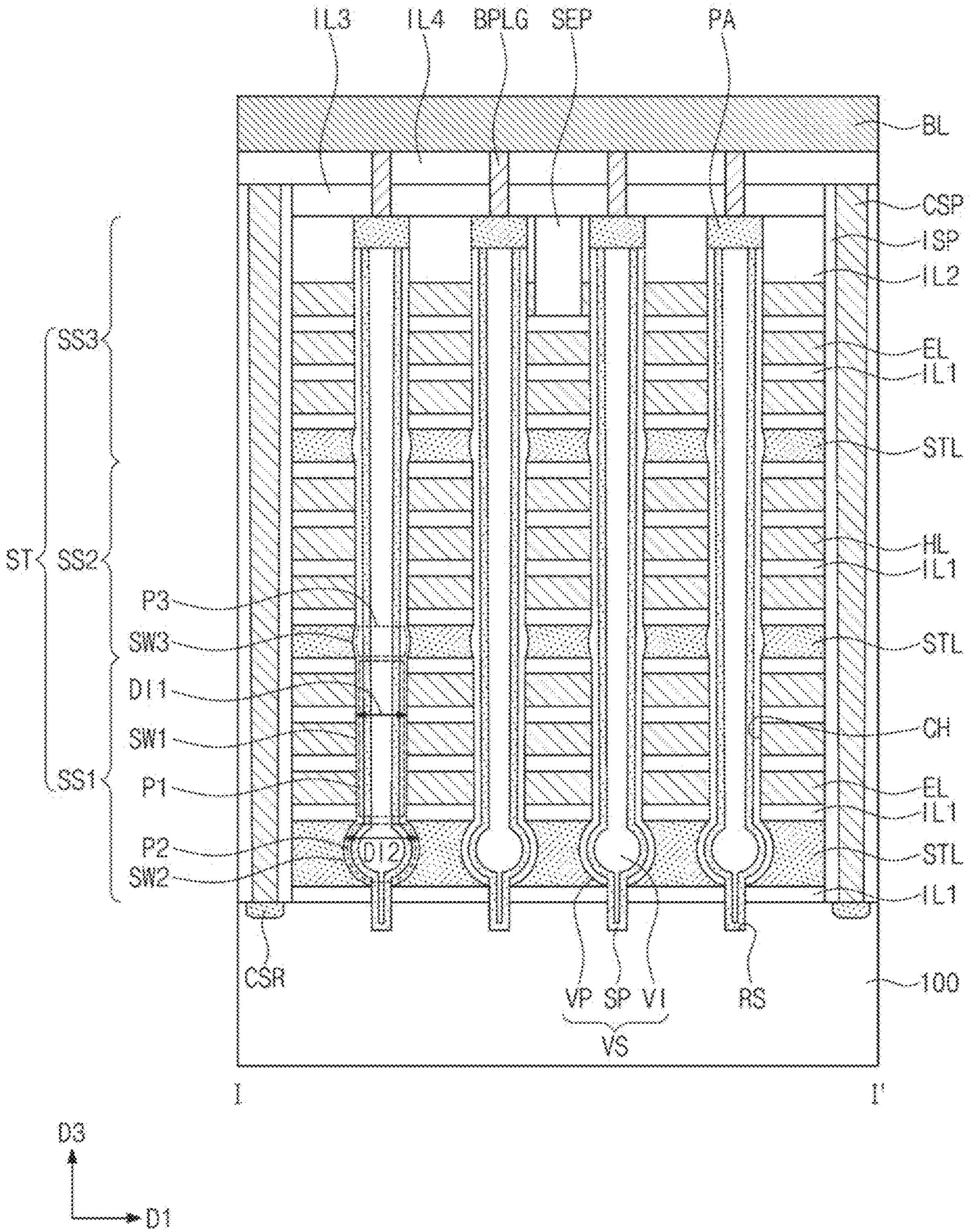

According to an example embodiment, referring to FIGS. 3 and 19, each of the vertical channel structures VS may include a first part P1, a second part P2, and a third part P3. For example, the first part P1 may be a portion of the vertical channel structure VS that penetrates the first dielectric layers IL1 and the electrodes EL of the first stack structure SS1 that are above the stopper layer STL of the first stack structure SS1. The second part P2 may be a portion of the vertical channel structure VS that penetrates a lowermost stopper layer STL. The second part P2 may be located at the same level as that of the lowermost stopper layer STL. The third part P3 may be a portion of the vertical channel structure VS that penetrates the stopper layer STL between the electrodes EL. The third part P3 may be located at the same level as that of the stopper layer STL between the electrodes EL.

The first part P1 may have a first sidewall SW1, the second part P2 may have a second sidewall SW2, and the third part P3 may have a third sidewall SW3. The second sidewall SW2 and the third sidewall SW3 may be bent (or non-linear). The first sidewall SW1 may be flat and not bent.

The first part P1 may have a columnar shape. For example, the first part P1 may have a diameter DI1 that gradually decreases with decreasing distance from the substrate 100. The second part P2 may have a round shape (e.g., oval shape) For example, the second part P2 may have a diameter DI2 that increases to maximum and then decreases with decreasing distance from the substrate 100. For example, the second part P2 may be relatively narrow at locations closer to the edges of the stopper layer STL and relatively wide at a middle portion of the stopper layer STL.

For example, formation of the channel holes CH filled with the vertical channel structures VS may further include performing a wet etching process that selectively etches the stopper layers STL in the aforementioned resultant structure of FIG. 9. The wet etching process may be executed until the channel holes CH expose a lowermost first dielectric layer IL1.

Figure 20:
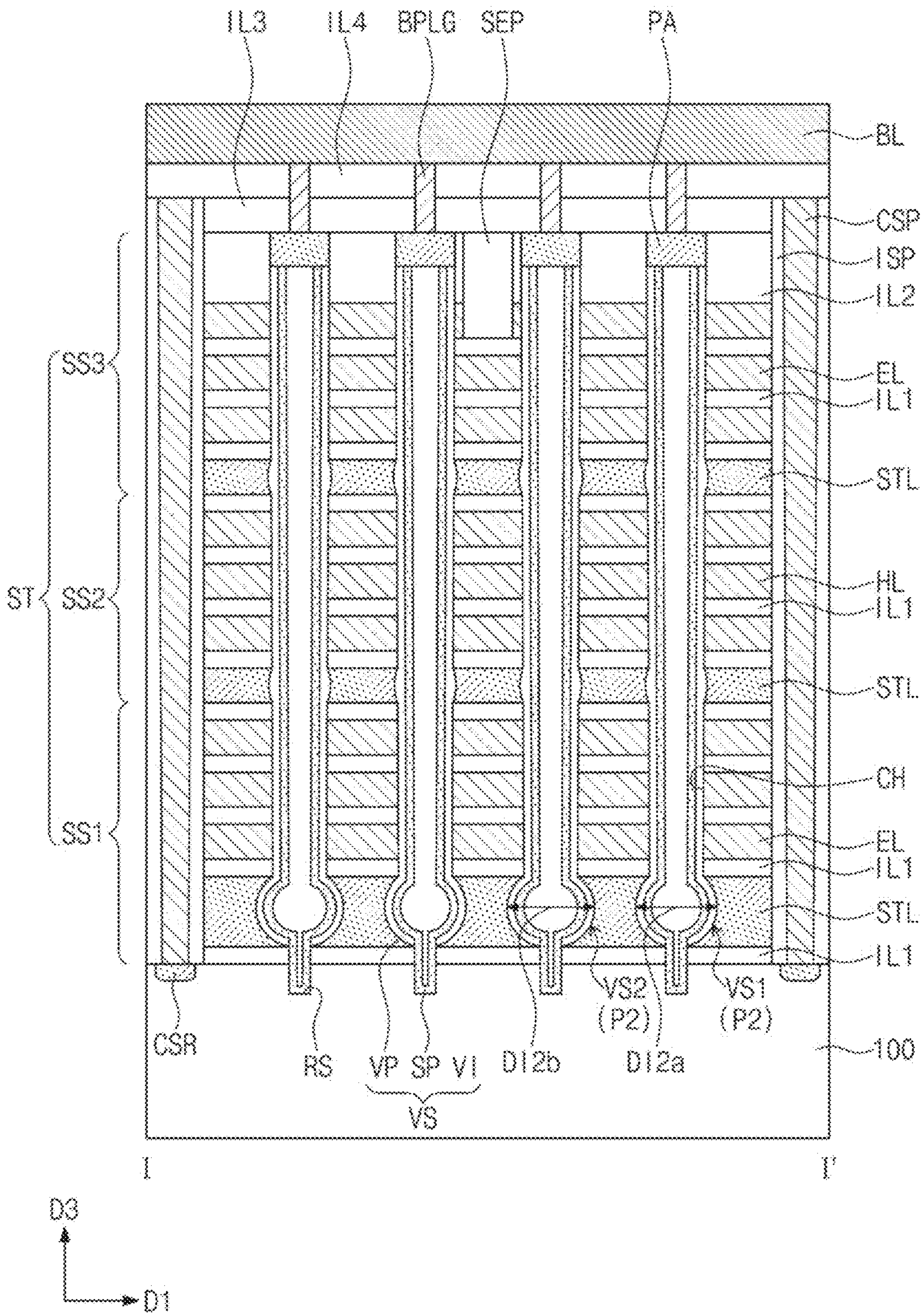

According to an example embodiment, referring to FIGS. 3 and 20, the second parts P2 of the vertical channel structures VS may have different sizes from each other. For example, the vertical channel structures VS may include a first vertical channel structure VS1 and a second vertical channel structure VS2 adjacent to the first vertical channel structure VS1. The second part P2 of the first vertical channel structure VS1 may have a maximum diameter DI2*a* less than a maximum diameter DI2*b* of the second part P2 of the second vertical channel structure VS2.

Figure 21:
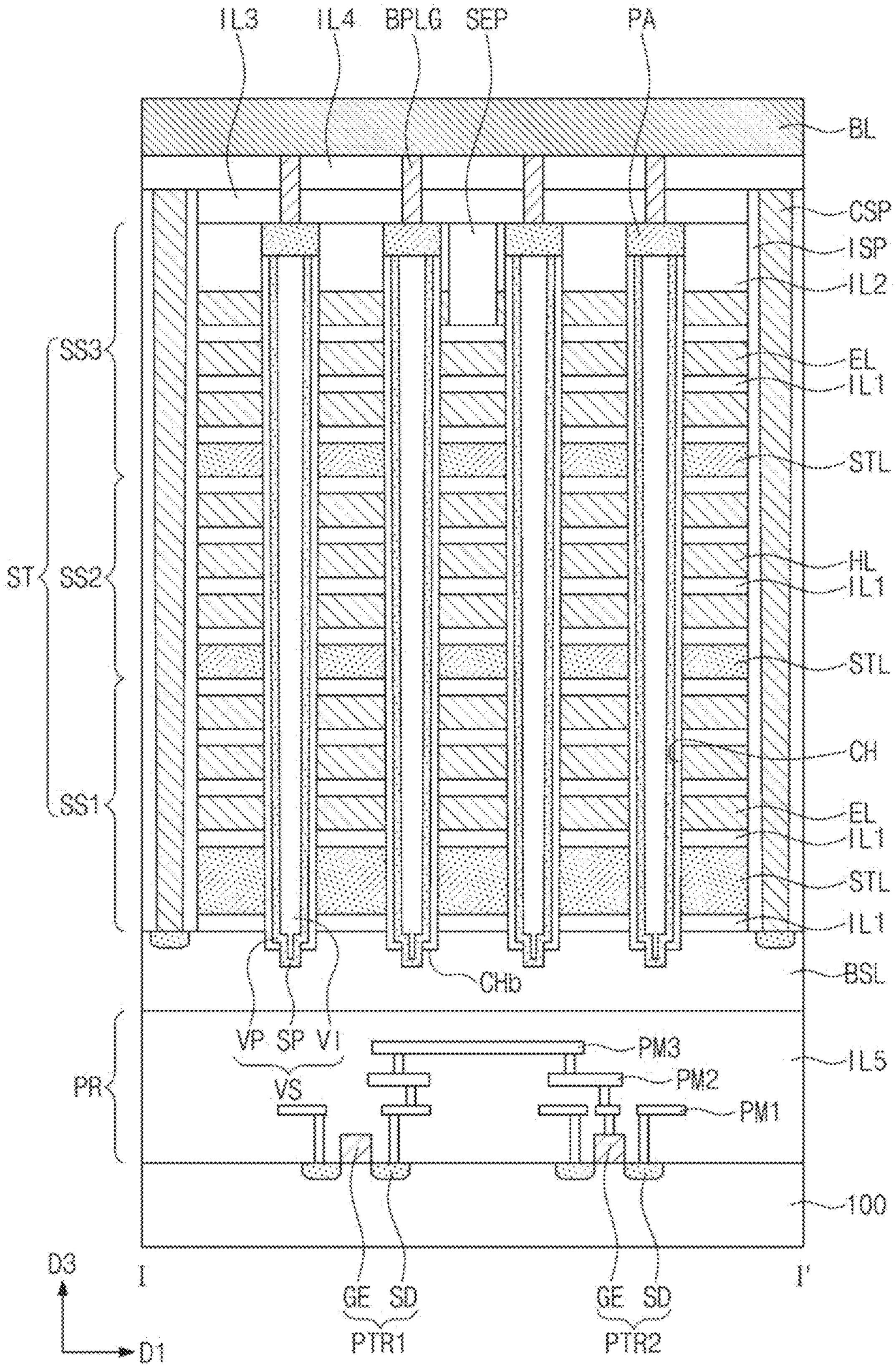

According to an example embodiment, referring to FIGS. 3 and 21, a peripheral circuit region PR may be provided on the substrate 100. The peripheral circuit region PR may include a plurality of transistors.

For example, the peripheral circuit region PR may include first and second peripheral transistors PTR1 and PTR2. Each of the first and second peripheral transistors PTR1 and PTR2 may include an impurity region SD doped in the substrate 100 and a gate electrode GE on the substrate 100.

The peripheral circuit region PR may include a first conductive line PM1, a second conductive line PM2, and a third conductive line PM3 that are sequentially stacked on the first and second peripheral transistors PTR1 and PTR2. For example, the first and second peripheral transistors PTR1 and PTR2 may be electrically connected to each other through the first, second, and third conductive lines PM1, PM2, and PM3.

A fifth dielectric layer IL5 that covers the first and second peripheral transistors PTR1 and PTR2 and the first, second, and third conductive lines PM1, PM2, and PM3 may be provided on the substrate 100.

A base semiconductor layer BSL may be provided on the fifth dielectric layer IL5. For example, the base semiconductor layer BSL may include a polysilicon layer. The stack structure ST may be provided on the base semiconductor layer BSL according to one or more example embodiments.

A semiconductor memory device according to one or more example embodiments may be configured in such a way that bottom surfaces of the vertical channel structures VS may be located at similar levels to each other. The bottom surfaces of the vertical channel structures VS may be controlled to reside inside the base semiconductor layer BSL. Therefore, it may be possible to avoid process defects due to the vertical channel structures VS penetrating through the base semiconductor layer BSL.

According to one or more example embodiments, a semiconductor memory device may include vertical channel structures whose bottoms are located at similar levels to each other. For example, even when a memory stack structure becomes higher, channel holes may have their bottoms all of which are located at similar levels to each other and positioned lower than a top surface of a substrate. As a result, it may be possible to avoid process defects that at least one of the vertical channel structures is not electrically connected to the substrate and also to increase reliability of devices.

It will be understood that when an element or layer is referred to as being "over," "above," "on," "connected to" or "coupled to" another element or layer, it can be directly over, above, on, connected or coupled to the other element or layer or intervening elements or layers may be present. In contrast, when an element is referred to as being "directly over," "directly above," "directly on," "directly connected to" or "directly coupled to" another element or layer, there are no intervening elements or layers present. As used herein, the term "and/or" includes any and all combinations of one or more of the associated listed items.

Although example embodiments have been described with reference to the accompanying drawings, it will be understood to those skilled in the art that various changes and modifications may be made without departing from the technical spirit and essential feature of the present disclosure. It will be apparent to those skilled in the art that various substitution, modifications, and changes may be thereto without departing from the scope and spirit of the present disclosure.

What is claimed is:

1. A semiconductor memory device, comprising:

a stack structure that comprises a plurality of dielectric layers spaced apart from each other on a substrate, a plurality of electrodes alternately arranged with the plurality of dielectric layers, and a plurality of stopper layers interspersed in the stack structure; and a vertical channel structure that penetrates the stack structure, wherein each of the plurality of electrodes is disposed in a first set of empty spaces between first pairs of the plurality of dielectric layers, and each of the plurality of stopper layers is disposed in a second set of empty spaces between second pairs of the plurality of dielectric layers, wherein the plurality of stopper layers comprises a first stopper layer and a second stopper layer that is interposed between the first stopper layer and the substrate, wherein the plurality of stopper layers and the plurality of dielectric layers include different materials that have different etch selectivity, and wherein at least one of the plurality of electrodes is interposed between the first stopper layer and the second stopper layer.

2. The semiconductor memory device of claim 1, wherein the plurality of dielectric layers comprises a first dielectric layer, a second dielectric layer, a third dielectric layer and a fourth dielectric layer, wherein the first dielectric layer is above the first stopper layer, wherein the second dielectric layer is below the first stopper layer, wherein the third dielectric layer is above the at least one of the plurality of electrodes, wherein the fourth dielectric layer is below the at least one of the plurality of electrodes, and wherein a thickness of at least one from among the first dielectric layer and the second dielectric layer is less than a thickness of at least one from among the third dielectric layer and the fourth dielectric layer.

3. The semiconductor memory device of claim 1, wherein the vertical channel structure comprises:

a semiconductor pattern in a channel hole that penetrates the stack structure; and a vertical dielectric pattern interposed between the semiconductor pattern and an inner sidewall of the channel hole.

4. The semiconductor memory device of claim 1, wherein a thickness of the second stopper layer is greater than a thickness of the first stopper layer.

5. The semiconductor memory device of claim 1, wherein the vertical channel structure comprises a first vertical channel structure formed in a first channel hole that penetrates the stack structure and a second vertical channel structure formed in a second channel hole that penetrates the stack structure, wherein a bottom of the first channel hole is lower than a top surface of the substrate, and wherein a bottom of the second channel hole is lower than the bottom of the first channel hole.

6. The semiconductor memory device of claim 1, wherein the vertical channel structure comprises:

a first region that penetrates the at least one of the plurality of electrodes interposed between the first stopper layer and the second stopper layer; and a second region that penetrates the second stopper layer, and wherein a rate of change in diameter of the first region is different from a rate of change in diameter of the second region.

7. The semiconductor memory device of claim 1, wherein the vertical channel structure comprises:

a first region that penetrates the at least one of the plurality of electrodes interposed between the first stopper layer and the second stopper layer; and a second region that penetrates the first stopper layer, wherein a change in diameter of the first region with respect to a first length is different from a change in diameter of the second region with respect to the first length.

8. The semiconductor memory device of claim 1, wherein the vertical channel structure comprises:

a first region that penetrates the at least one of the plurality of electrodes interposed between the first stopper layer and the second stopper layer; and a second region that penetrates the second stopper layer, wherein a diameter of the first region decreases with decreasing distance from the substrate, and wherein a diameter of the second region increases and then decreases with decreasing distance from the substrate.

9. A semiconductor memory device, comprising:

a stack structure disposed on a substrate; and a vertical channel structure that penetrates the stack structure, wherein the stack structure comprises:

a first stopper layer;

a second stopper layer provided between the first stopper layer and the substrate; and a plurality of dielectric layers and a plurality of electrodes that are alternately stacked between the first stopper layer and the substrate, wherein the first stopper layer and the plurality of dielectric layers include different materials that have different etch selectivity, wherein a first distance is provided between bottom surfaces of a first electrode and a second electrode, from among the plurality of electrodes, that are adjacent to each other, wherein a second distance is provided between a bottom surface of the first stopper layer and a bottom surface of an uppermost one of the plurality of electrodes, and wherein the first distance and the second distance are substantially the same.

10. The semiconductor memory device of claim 9, wherein the plurality of dielectric layers comprises:

a first dielectric layer that covers the bottom surface of the first stopper layer; and a second dielectric layer interposed between the first electrode and the second electrode.

11. The semiconductor memory device of claim 9, wherein a thickness of the second stopper layer is greater than a thickness of the first stopper layer.

12. The semiconductor memory device of claim 9, wherein the vertical channel structure comprises a first vertical channel structure formed in a first channel hole of the stack structure and a second vertical channel structure formed in a second channel hole of the stack structure, wherein a bottom of the first channel hole is lower than a top surface of the substrate, and wherein a bottom of the second channel hole is lower than the bottom of the first channel hole.

13. The semiconductor memory device of claim 9, wherein a third distance is provided between a top surface of the first stopper layer and a top surface of the uppermost electrode, and wherein the second distance and the third distance are substantially the same.

14. The semiconductor memory device of claim 9, wherein the vertical channel structure comprises:

a first region that penetrates one of the plurality of electrodes; and a second region that penetrates the first stopper layer, wherein a change in diameter of the first region with respect to a first length is different from a change in diameter of the second region with respect to the first length.

15. The semiconductor memory device of claim 9, wherein the plurality of dielectric layers comprises a first dielectric layer, a second dielectric layer, a third dielectric layer and a fourth dielectric layer, wherein the first dielectric layer is above the first stopper layer, wherein the second dielectric layer is below the first stopper layer, wherein the third dielectric layer is above one of the plurality of electrodes, wherein the fourth dielectric layer is below the one of the plurality of electrodes, and wherein a thickness of at least one from among the first dielectric layer and the second dielectric layer is less than a thickness of at least one from among the third dielectric layer and the fourth dielectric layer.

16. A semiconductor memory device, comprising:

a first stack structure disposed on a substrate, the first stack structure comprising a first stopper layer, a first plurality of dielectric layers and a first plurality of electrodes, the first plurality of dielectric layers and the first plurality of electrodes being alternately stacked on the first stopper layer;

a second stopper layer, the first stack structure being provided between the substrate and the second stopper layer, and a vertical channel structure that penetrates the first stack structure and the second stopper layer, wherein the vertical channel structure comprises:

a first region that penetrates the first plurality of dielectric layers and the first plurality of electrodes; and a second region that penetrates the second stopper layer, and wherein a change in diameter of the first region with respect to a first length is different from a change in diameter of the second region with respect to the first length.

17. The semiconductor memory device of claim 16, wherein the first region has a first sidewall, wherein the second region has a second sidewall, and wherein an inclination of the first sidewall is different from an inclination of the second sidewall.

18. The semiconductor memory device of claim 16, wherein the change in diameter of the first region is less than the change in diameter of the second region.

19. The semiconductor memory device of claim 16, further comprising a second stack structure disposed on the first stack structure, the second stack structure comprising the second stopper layer, a second plurality of dielectric layers and a second plurality of electrodes, the second plurality of dielectric layers and the second plurality of electrodes being alternately stacked on the second stopper layer, wherein the vertical channel structure penetrates the first stack structure and the second stack structure.

20. The semiconductor memory device of claim 16, wherein a first distance is provided between top surfaces of a first electrode and a second electrode, from among the first plurality of electrodes, that are adjacent to each other, wherein a second distance is provided between a top surface of the first stopper layer and a top surface of a lowermost one of the first plurality of electrodes, and wherein the first distance and the second distance are substantially the same.

* * * * *